United States Patent
Choi et al.

(10) Patent No.: US 11,047,893 B2
(45) Date of Patent: Jun. 29, 2021

(54) ANTENNA FOR ELECTROMAGNETIC INTERFERENCE DETECTION AND PORTABLE ELECTRONIC DEVICE INCLUDING THE SAME

(71) Applicant: Samsung Electronics Co., Ltd., Suwon-si (KR)

(72) Inventors: Jin-Chul Choi, Yongin-si (KR); Hyunwoo Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 62 days.

(21) Appl. No.: 16/174,659

(22) Filed: Oct. 30, 2018

(65) Prior Publication Data

US 2019/0128937 A1 May 2, 2019

(30) Foreign Application Priority Data

Oct. 30, 2017 (KR) .................. 10-2017-0142867

(51) Int. Cl.
*G01R 29/12* (2006.01)
*G01R 29/08* (2006.01)
(Continued)

(52) U.S. Cl.
CPC ..... *G01R 29/0814* (2013.01); *G01R 29/0892* (2013.01); *G01R 31/002* (2013.01);
(Continued)

(58) Field of Classification Search
CPC ............ G01R 29/08; G01R 29/0807; G01R 29/0814; G01R 29/0878; G01R 29/0892;
(Continued)

(56) References Cited

U.S. PATENT DOCUMENTS 5,697,958 A * 12/1997 Paul .................. A61N 1/37
607/31
7,541,818 B2 * 6/2009 Kosaka ............... G01R 31/001
324/754.29

(Continued)

FOREIGN PATENT DOCUMENTS

CN 102904014 A 1/2013
CN 105264711 A 1/2016
(Continued)

OTHER PUBLICATIONS

Search Report and Written Opinion dated Feb. 7, 2019 in counterpart International Patent Application No. PCT/KR2018/013003.
(Continued)

*Primary Examiner* — Thang X Le
(74) *Attorney, Agent, or Firm* — Nixon & Vanderhye P.C.

(57) ABSTRACT

According to an embodiment, an electronic device may include a display, a Printed Circuit Board (PCB), a communication module comprising communication circuitry disposed to the PCB, an Electro Magnetic Interference (EMI) detection module comprising EMI detecting circuitry disposed to the PCB, at least one antenna electrically coupled to the communication module and the EMI detection module, and a processor, wherein the processor is configured to: output an image using the display, control a communication configuration of the electronic device with an external electronic device using the communication module, detect an EMI signal using the antenna and the EMI detection module, and perform a designated operation based on at least the detected EMI signal.

18 Claims, 20 Drawing Sheets

(51) Int. Cl.

| | | |
|---|---|---|
| *G01R 31/00* | (2006.01) | |
| *H01Q 3/24* | (2006.01) | |
| *H01Q 5/35* | (2015.01) | |
| *H01Q 5/364* | (2015.01) | |
| *H01Q 5/335* | (2015.01) | |
| *H01Q 5/50* | (2015.01) | |
| *H01Q 1/44* | (2006.01) | |
| *G06F 1/16* | (2006.01) | |
| *H05K 1/02* | (2006.01) | |
| *H02J 7/02* | (2016.01) | |

(52) U.S. Cl.
CPC ............ *G06F 1/163* (2013.01); *G06F 1/1698* (2013.01); *H01Q 1/44* (2013.01); *H01Q 3/24* (2013.01); *H01Q 5/335* (2015.01); *H01Q 5/35* (2015.01); *H01Q 5/364* (2015.01); *H01Q 5/50* (2015.01); *H05K 1/0233* (2013.01); *H05K 1/0259* (2013.01); *H02J 7/025* (2013.01); *H05K 2201/10128* (2013.01); *H05K 2201/10151* (2013.01)

(58) Field of Classification Search
CPC ......... G01R 31/001; G06F 1/16; G06F 3/011; G06F 3/014; G06F 3/017; G06F 3/0414; G06F 3/0416; G06F 3/0418; G06F 3/046
See application file for complete search history.

(56) References Cited

U.S. PATENT DOCUMENTS

| | | | | |
|---|---|---|---|---|
| 7,613,580 | B2 * | 11/2009 | Gross | G01R 31/002 324/628 |
| 9,224,019 | B2 | 12/2015 | Weigmann et al. | |
| 2011/0095934 | A1 | 4/2011 | Freeman et al. | |
| 2011/0121865 | A1 * | 5/2011 | Olmos | H03K 19/00384 327/77 |
| 2013/0002266 | A1 * | 1/2013 | Kraft | A61B 5/14532 324/613 |
| 2013/0238264 | A1 * | 9/2013 | Kazama | G01R 31/088 702/59 |
| 2014/0084133 | A1 | 3/2014 | Weigmann et al. | |
| 2014/0106684 | A1 * | 4/2014 | Burns | H01Q 1/243 455/78 |
| 2014/0361979 | A1 | 12/2014 | Woo et al. | |
| 2015/0048846 | A1 | 2/2015 | Post et al. | |
| 2015/0118986 | A1 * | 4/2015 | Bartels | H04B 1/12 455/296 |
| 2016/0259432 | A1 | 9/2016 | Bau et al. | |
| 2016/0323048 | A1 * | 11/2016 | Hisch | G01S 11/16 |
| 2017/0047637 | A1 | 2/2017 | Kim et al. | |
| 2017/0141820 | A1 | 5/2017 | Kim et al. | |
| 2017/0212161 | A1 | 7/2017 | Hoad et al. | |

FOREIGN PATENT DOCUMENTS

| | | |
|---|---|---|
| CN | 205247351 U | 5/2016 |
| CN | 106708309 A | 5/2017 |
| JP | 2002-85790 | 3/2002 |
| KR | 10-2015-0048210 | 5/2015 |
| WO | WO 2017/048066 | 3/2017 |

OTHER PUBLICATIONS

Extended Search Report dated Mar. 29, 2019 in counterpart European Patent Application No. 18203361.3.

Chinese Office Action dated Mar. 3, 2021 for CN Application No. 201811277546.6.

* cited by examiner

ANTENNA FOR ELECTROMAGNETIC INTERFERENCE DETECTION AND PORTABLE ELECTRONIC DEVICE INCLUDING THE SAME

CROSS REFERENCE TO RELATED APPLICATION

This application is based on and claims priority under 35 U.S.C. § 119 to Korean Patent Application No. 10-2017-0142867, filed on Oct. 30, 2017, in the Korean Intellectual Property Office, the disclosure of which is incorporated by reference herein in its entirety.

BACKGROUND

Field

The disclosure relates to an antenna for electromagnetic interference detection and a portable electronic device including the antenna.

Description of Related Art

A portable electronic device such as a portable communication device, a mobile terminal, a mobile communication terminal, a smart phone, or the like may communicate with an external electronic device located at a far distance using a communication circuit and an antenna, or may establish connectivity with an external device located at a near distance using a specific network (e.g., WiFi, Bluetooth, infrared communication, ZigBee, etc.). The portable electronic device may be used for the purpose of voice communication and/or video communication with a peer user at a far distance or for communication with a peripheral external electronic device as a portable electronic device or for the control of the peripheral external electronic device.

SUMMARY

A portable electronic device needs to perform a complex process for activating a connectivity function to couple peripheral external electronic devices located at a near distance, searching for a peripheral external device, and for selecting and coupling any one of the found external devices. Accordingly, the electronic device may be required to provide a system in which a user can be induced to easily access a desired device.

According to various embodiments of the present disclosure, there may be provided an antenna for Electro Magnetic Interference (EMI) detection and a portable electronic device including the antenna.

According to various embodiments, there may be provided a portable electronic device capable of classifying an external electronic device using a unique signal (e.g., information, a waveform or a frequency) of EMI detected from the external electronic device, and capable of performing a corresponding function.

According to various embodiments, an electronic device may include: a display, a Printed Circuit Board (PCB), a communication module comprising communication circuitry disposed to the PCB, an Electro Magnetic Interference (EMI) detection module comprising EMI detecting circuitry disposed to the PCB, at least one antenna electrically coupled in common to the communication module and the EMI detection module, and a processor. The processor may be configured to output an image using the display, control a communication configuration with an external electronic device using the communication module, detect an EMI signal using the antenna and the EMI detection module, and perform a designated operation at least based on the detected EMI signal.

According to various embodiments, an electronic device may include a housing including a front plate, a rear plate spaced apart and facing a direction opposite the front plate, and a lateral member surrounding a space between the front plate and the rear plate, a display accommodated using at least part of the housing, a PCB, a communication module comprising communication circuitry disposed to the PCB, an EMI detection module comprising detection circuitry disposed to the PCB, at least one first antenna electrically coupled with the communication module, at least one second antenna electrically coupled with the EMI detection module, and a processor. The processor may be configured to output an image using the display, control a communication configuration with an external electronic device using the communication module, detect an EMI signal using the second antenna and the EMI detection module, and perform a designated operation at least based on the detected EMI signal.

According to various embodiments of the present disclosure, the external electronic device can be classified simply by an operation of approaching a peripheral external electronic device, and a corresponding function related to the external electronic device may be automatically performed, thereby improving usability of a device.

In addition, a portable electronic device uses an antenna electrically coupled with a communication module together as an antenna element for detecting a unique signal of EMI generated from a peripheral external electronic device, thereby relatively contributing to making the electronic device slim while improving a function of the electronic device.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
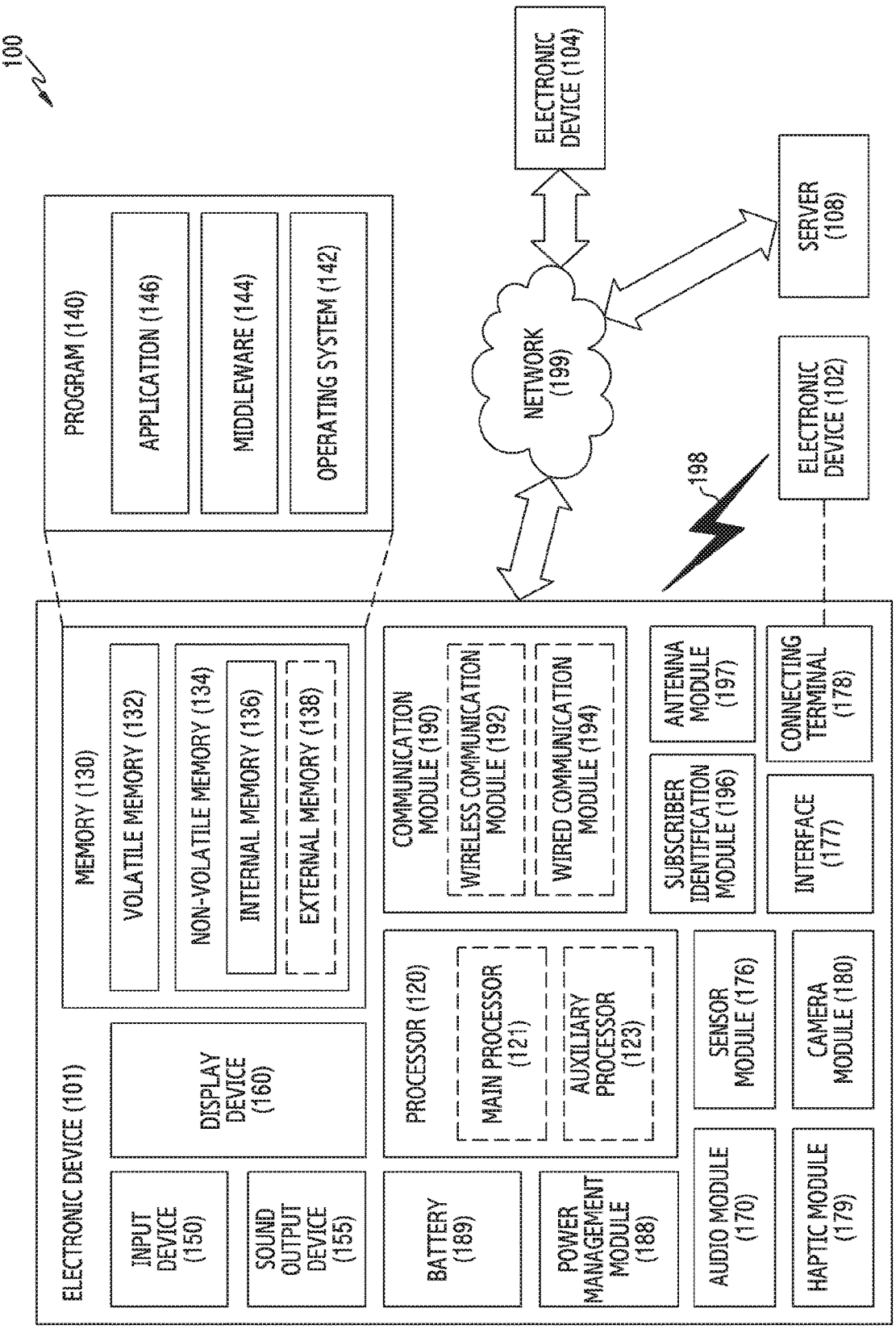
FIG. 1 is a block diagram illustrating an electronic device in a network environment, including an antenna for Electro Magnetic Interference (EMI) detection, according to various embodiments of the present disclosure.

FIG. 1 is a block diagram illustrating an electronic device in a network environment according to various embodiments of the present disclosure.

Referring to FIG. 1, an electronic device 101 in the network environment may communicate with an electronic device 102 via a first network 198 (e.g., short-range wireless communication), or an electronic device 104 or a server 108 via a second network 199 (e.g., long-range wireless communication). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a Subscriber Identification Module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented in an integrated manner, for example, as in a case of the sensor module 176 (e.g., a fingerprint sensor, an iris sensor, or an illuminance sensor) embedded in the display device 160 (e.g., a display).

The processor 120 may drive, for example, software (e.g., a program 140) to control at least one other component (e.g., a hardware or software component) of the electronic device 101 coupled with the processor 120, and may perform various data processing or computation. The processor 120 may load a command or data received from other components (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit or an application processor), and an auxiliary processor 123 (e.g., a graphics processing unit, an image signal processor, a sensor hub processor, or a communication processor) that is operable independently from, or in conjunction with, the main processor 121. Additionally or alternatively, the auxiliary processor 123 may be adapted to consume less power than the main processor 121, or to be specific to a specified function. Herein, the auxiliary processor 123 may be implemented as separate from, or imbedded in the main processor 121.

In this case, the auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data, for example, software (e.g., the program 140) and input data or output data for a command related thereto, used by at least one component (e.g., the processor 120 or the sensor module 176) of the electronic device 101. The memory 130 may include the volatile memory 132 or the non-volatile memory 134.

The program 140 may be stored in the memory 130 as software, and may include, for example, an operating system 142, middleware 144, or an application 146.

The input device 150 may be a device for receiving a command or data to be used by a component (e.g., the processor 120) of the electronic device 101 from the outside (e.g., a user) of the electronic device 101, and may include, for example, a microphone, a mouse, or a keyboard.

The sound output device 155 may be a device for outputting sound signals to the outside of the electronic device 101, and may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may be a device for visually provide information to a user of the electronic device 101, and may include, for example, a display, a hologram device, or a projector and control circuitry to control a corresponding device. According to an embodiment, the display device 160 may include touch circuitry or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or, for example, an external electronic device (e.g., an electronic device 102, for example, a speaker or a headphone)) wiredly or wirelessly coupled with the electronic device 101.

The sensor module 176 may generate an electrical signal or data value corresponding to an internal operational state (e.g., power or temperature) of the electronic device 101 or an external environmental state. The sensor module 176 may include, for example, a gesture sensor, a gyro sensor, an atmospheric pressure sensor, a magnetic sensor, an acceleration sensor, a grip sensor, a proximity sensor, a color sensor, an Infrared (IR) sensor, a biometric sensor, a temperature sensor, a humidity sensor, or an illuminance sensor.

The interface 177 may support a specified protocol to be coupled with the external electronic device (e.g., the electronic device 102) wiredly or wirelessly. According to an embodiment, the interface 177 may include, for example, a High Definition Multimedia Interface (HDMI), a Universal Serial Bus (USB) interface, a Secure Digital (SD) card interface, or an audio interface.

A connection terminal 178 may include a connector via which the electronic device 101 can be physically coupled with the external electronic device (e.g., the electronic device 102), and may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via tactile sensation or kinesthetic sensation. The haptic module 179 may include, for example, a motor, a piezoelectric element, or an electric stimulator.

The camera module 180 may capture still images or moving images. According to an embodiment, the camera module 180 may include one or more lenses, image sensors, image signal processors, or flashes.

The power management module 188 may be a module for managing power supplied to the electronic device 101, and may be implemented as at least part of, for example, a Power Management Integrated Circuit (PMIC).

The battery 189 may be a device for supplying power to at least one component of the electronic device 101, and may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor) and supports a wired communication or a wireless communication. According to an embodiment, the communication module 190 may include a wireless communication module 192 (e.g., a cellular communication module, a short-range wireless communication module, or a Global Navigation Satellite System (GNSS) communication module) or a wired communication module 194 (e.g., a Local Area Network (LAN) communication module or a power line communication module). A corresponding one of these communication modules may communicate with the external electronic device via the first network 198 (e.g., a short-range communication network, such as Bluetooth™, Wireless-Fidelity (Wi-Fi) direct, or Infrared Data Association (IrDA)) or the second network 199 (e.g., a long-range communication network, such as a cellular network, the Internet, or a computer network (e.g., LAN or Wide Area Network (WAN)). These various types of the communication modules 190 may be implemented as a single chip, or may be implemented as chips separate from each other.

According to an embodiment, the wireless communication module 192 may identify and authenticate the electronic device 101 in a communication network by using user information stored in the SIM 196.

The antenna module 197 may include one or more antennas for transmitting or receiving a signal or power to or from the outside. According to an embodiment, the communication module 190 (e.g., the wireless communication module 192) may transmit or receive a signal to or from the external electronic device via an antenna appropriate for a communication scheme.

At least some of the above-described components may be coupled mutually and communicate signals (e.g., commands or data) therebetween via an inter-peripheral communication scheme (e.g., a bus, General Purpose Input and Output (GPIO), Serial Peripheral Interface (SPI), or Mobile Industry Processor Interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type from, the electronic device 101. According to an embodiment, all or some of operations to be executed at the electronic device 101 may be executed at one or more of the external electronic devices. According to an embodiment, if the electronic device 101 should perform a function or a service automatically, or in response to a request, the electronic device 101, instead of, or in addition to, executing the function or the service, may request the one or more external electronic devices to perform at least part of the function or the service. The external electronic devices receiving the request may perform the requested function or an additional function, and transfer an outcome of the performing to the electronic device 101. The electronic device 101 may provide the requested function or service, with or without further processing of the outcome. To that end, a cloud computing, for example, distributed computing, or client-server computing technology may be used.

The electronic device according to various embodiments disclosed in the present disclosure may be any of various types of electronic devices. The electronic devices may include, for example, and without limitation, a portable communication device (e.g., a smart phone), a computer device, a portable multimedia device, a portable medical device, a camera, a wearable device, and/or a home appliance, or the like. According to an embodiment of the disclosure, the electronic device is not limited to the aforementioned devices.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. A singular expression may include a plural expression unless there is a contextually distinctive difference. In the present disclosure, expressions such as "A or B", "at least one of A and/or B", "A, B, or C", or "at least one of A, B, and/or C" may include all possible combinations of items enumerated together. Expressions such as "$1^{st}$" and "$2^{nd}$" or "first" and "second" may be used to simply distinguish a corresponding component from another, and does not limit the component in other aspect (e.g., importance or order). When a certain (e.g., $1^{st}$) component is mentioned as being "operatively or communicatively coupled with/to" or "connected to" a different (e.g., $2^{nd}$) component, the certain component is directly coupled with/to the different component or can be coupled with/to the different component via another (e.g., $3^{rd}$) component.

As used herein, the term "module" may include a unit implemented in hardware, software, and/or firmware, or any combinations thereof, and may interchangeably be used with other terms, for example, "logic", "logic block", "component", or "circuitry". The module may be a single integral component, or a minimum unit or part thereof, adapted to perform one or more functions. For example, the module may be implemented with an Application-Specific Integrated Circuit (ASIC).

Various embodiments of the present disclosure may be implemented as software (e.g., the program 140) including instructions that are stored in a storage medium (e.g., an internal memory 136 or an external memory 138) that is readable by a machine (e.g., a computer). The machine may include an electronic device (e.g., the electronic device 101) according to the disclosure embodiments, as a device which invokes the stored instructions from the medium and is operable according to the instruction invoked. When the instruction is executed by a processor (e.g., the processor 120), the processor may perform a function corresponding to the instruction using other components directly or under the control of the processor. The instruction may include a code generated or executed by a complier or an interpreter. The machine-readable storage medium may be provided in the form of a non-transitory storage medium. Herein, the term "non-transitory" simply means that the storage medium is a tangible device.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. According to various embodiments, some of the above-described sub components may be omitted, or other sub components may be further included. Alternatively or additionally, some components (e.g., modules or programs) may be integrated into a single entity, and thus may perform functions in the same or similar manner as they are performed by corresponding respective components before the integration. According to various embodiments, operations performed by the module, the program, or another component may be carried out sequentially, in parallel, repeatedly, or heuristically, or at least some operations may be executed in a different order or omitted, or other operations may be added.

According to various embodiments, a sensor module may include an EMI detection module (e.g., including EMI detection circuitry) for detecting a unique signal corresponding to EMI generated from an external electronic device. According to an embodiment, an antenna module may include an antenna disposed separately to at least part of an inner and/or outer (surface) portion of the electronic device to detect the EMI. However, without being limited thereto, an antenna for communication may be used together to detect the EMI.

According to various embodiments, a processor may compare unique signal information of the external electronic device, provided from the EMI detection module, with a signal table (e.g., a look-up table) stored in a memory. According to an embodiment, the processor may display information of the external electronic device, corresponding to the same signal, via a display of an electronic device based on the comparison result. According to an embodiment, the processor may automatically perform a pre-set function based on the information of the classified external electronic device. According to an embodiment, the processor may activate connectivity with the external electronic device via the wireless communication module 192 (e.g., a short-range wireless communication module including communication circuitry) and may allow the external electronic device to transition to a controllable state. According to an embodiment, the processor may execute at least one different pre-set application based on the information of the classified external electronic device.

Figure 2A:
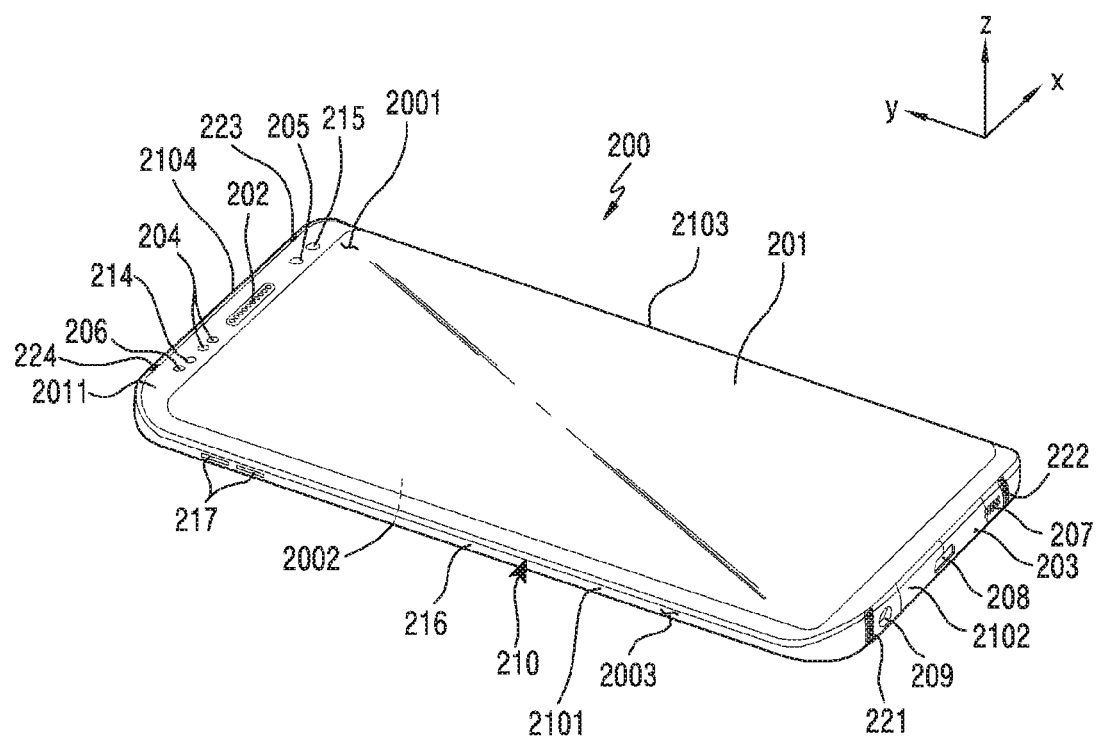
FIG. 2A and FIG. 2B are perspective views of an electronic device according to various embodiments of the present disclosure.
Figure 2B:
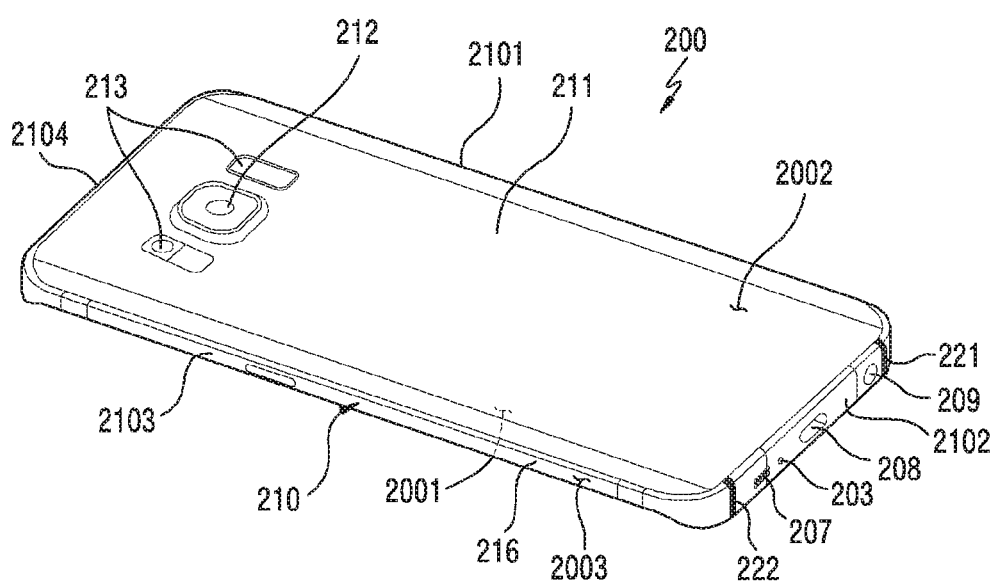

FIG. 2A and FIG. 2B are perspective views of an electronic device according to various embodiments of the present disclosure.

FIG. 2A may be a front perspective of the electronic device, and FIG. 2B may be a rear perspective view of the electronic device.

An electronic device 200 of FIG. 2A and FIG. 2B may be at least partially similar to the electronic device 101 of FIG. 1, or may include other embodiments of the electronic device.

Referring to FIG. 2A and FIG. 2B, the electronic device 200 (e.g., the electronic device 101) may include a housing 210. According to an embodiment, the housing 210 may be constructed of a conductive member and/or a non-conductive member. According to an embodiment, the housing 210 may include a first side 2001 (e.g., a front side or an upper side) facing a first direction (e.g., a Z-axis direction), a second side 2002 (e.g., a rear side or a lower side) disposed facing away from (e.g., a direction opposite) the first side 2001, and a lateral side 2003 disposed to surround at least part of the first side 2001 and the second side 2002. According to an embodiment, the lateral side 2003 may be coupled with a front plate 2011 (e.g., a glass plate including various coating layers, or a polymer plate) and a rear plate 211, and may be constructed by a lateral member (or a side member) 216 including metal (e.g., a conductive member) and/or polymer (e.g., a non-conductive member). According to an embodiment, the rear plate 211 may be constructed of, for example, coated or colored glass, ceramic, polymer, metallic materials (e.g. aluminum, Stainless Steel (STS), or magnesium) or a combination of at least two of the these materials.

According to various embodiments, the lateral side 2003 may be combined with the front plate 2011 and the rear plate 211, and may be constructed by the lateral member 216 (or a lateral bezel structure) including metal and/or polymer. According to an embodiment, the rear plate 211 and the lateral member 216 may be constructed in an integral manner and may include the same material (e.g., a metallic material such as aluminum or magnesium). According to an embodiment, the lateral member 216 may include a first lateral side 2101 having a first length, a second lateral side 2102 extended from the first lateral side 2101 in a vertical direction and having a second length, a third lateral side 2103 extended from the second lateral side 2102 to have the first length in parallel with the first lateral side 2101, and a fourth lateral side 2104 extended from the third lateral side 2103 to have the second length in parallel with the second lateral side 2102. According to an embodiment, the second lateral side 2102 may be constructed as the unit conductive segment 2102 constructed to be electrically separated by a pair of non-conductive segments 221 and 222 separated with a specific interval. In addition, the fourth lateral side 2104 may also be constructed as the unit conductive segment 2104 electrically separated by a pair of non-conductive segments 223 and 224 with a specific interval. According to an embodiment, the electrically separated conductive segments 2102 and 2104 may be utilized as an antenna operating in at least one resonance frequency band by being electrically coupled with a wireless communication module disposed inside the electronic device 200. According to an embodiment, at least one conductive segment of the conductive segments 2102 and 2104 may be used together as an antenna element for EMI detection.

According to various embodiments, the electronic device 200 may include the front plate 2011 (e.g., a window or glass plate) disposed to the first side 2001, and a display 201 (e.g., a touch screen display) disposed to be exposed through at least some regions of the front plate 2011. According to an embodiment, the display 201 may be disposed adjacent to or bonded to a touch sensing circuit, a pressure sensor capable of measuring touch strength (pressure), and/or a pen detection sensor (e.g., a digitizer) for detecting a stylus pen of a magnetic field type.

According to various embodiments, the electronic device 200 may include a communication receiver hole 202. According to an embodiment, the electronic device 200 may be controlled to use a speaker disposed therein to speak with the other party via the communication receiver hole 202. According to an embodiment, the electronic device 200 may include a microphone hole 203. According to an embodiment, the electronic device 200 may use at least one microphone disposed therein and capable of sensing a direction of a sound, and may receive an external sound through the microphone hole 203 or transmit a user's voice to the other party.

According to various embodiments, the electronic device 200 may include at least one key input device 217. According to an embodiment, the key input device 217 may include at least one side key button 217 disposed to the lateral side 2003 of the housing 210. According to an embodiment, the at least one side key button 217 may include a volume control button, a wake-up button, or a button for performing a specific function (e.g., a function of executing artificial intelligence, a function of entering a fast speech recognition execution mode, etc.).

According to various embodiments, the electronic device 200 may include components for performing various functions of the electronic device 200 by being disposed to be exposed to the display 201 or by being disposed not to be exposed while performing a function through the front plate 2011. According to an embodiment, at least part of components may be disposed to be in contact with an outer environment from an inner side of the electronic device via at least part of the front plate 2011 of a transparent material. According to an embodiment, the components may include at least one sensor module 204. The sensor module 204 may include, for example, an illumination sensor (e.g., an optical sensor), a proximity sensor (e.g., an optical sensor), an infrared sensor, an ultrasonic sensor, a fingerprint sensor, a face recognition sensor, or an iris recognition sensor. According to an embodiment, the component may include a first camera device 205. According to an embodiment, the component may include an indicator 206 (e.g., an LED device) for visually presenting status information of the electronic device 200 to a user. According to an embodiment, the component may include a light source 214 (e.g., an infrared LED) disposed to one side of the receiver 202. According to an embodiment, the component may include an imaging sensor assembly 215 (e.g., an iris camera) to detect an iris image in a state in which light generated from the light source 214 is irradiated around a user's eye. According to an embodiment, at least one of these components may be disposed to be exposed through at least some regions of the second side 2002 (e.g., a rear side or a back side) facing a direction (e.g., −Z-axis direction) opposite to a first direction of the electronic device 200.

According to various embodiments, the electronic device 200 may include an external speaker hole 207. According to an embodiment, the electronic device 200 may use a speaker disposed therein to output a sound through the external speaker hole 207. According to an embodiment, the electronic device 200 may include a first connector hole 208 (e.g., an interface connector port) to charge the electronic device 200 using a data transmission/reception function and external power provided by an external device. According to an embodiment, the electronic device 200 may include a second connector hole 209 (e.g., an ear jack assembly) to accommodate an ear jack of the external device.

According to various embodiments, the electronic device 200 may include the rear plate 211 (e.g., a rear window) disposed to the second side 2002. According to an embodiment, a rear camera device 212 may be disposed to the rear plate 211. At least one electronic component 213 may be disposed around the rear camera device 212. According to an embodiment, the electronic component 213 may include at least one of an illumination sensor (e.g., an optical sensor), a proximity sensor (e.g., an optical sensor), an infrared sensor, an ultrasonic sensor, a heartrate sensor, a fingerprint recognition sensor, and a flash device.

According to various embodiments, the display 201 may include a touch panel and display panel stacked on the rear side of the front plate 2011. According to an embodiment, an image displayed through the display panel may be provided to the user through the front plate 2011 of a transparent material. According to an embodiment, various materials such as transparent glass or acrylic may be used as the front plate 2011.

According to various embodiments, the electronic device 200 may include a waterproof structure. According to an embodiment, the electronic device 200 may include at least one sealing member for waterproofing. According to an embodiment, at least one sealing member may be disposed between the display 201 and the housing 210 and/or between the housing 210 and the rear plate 211.

Figure 3:
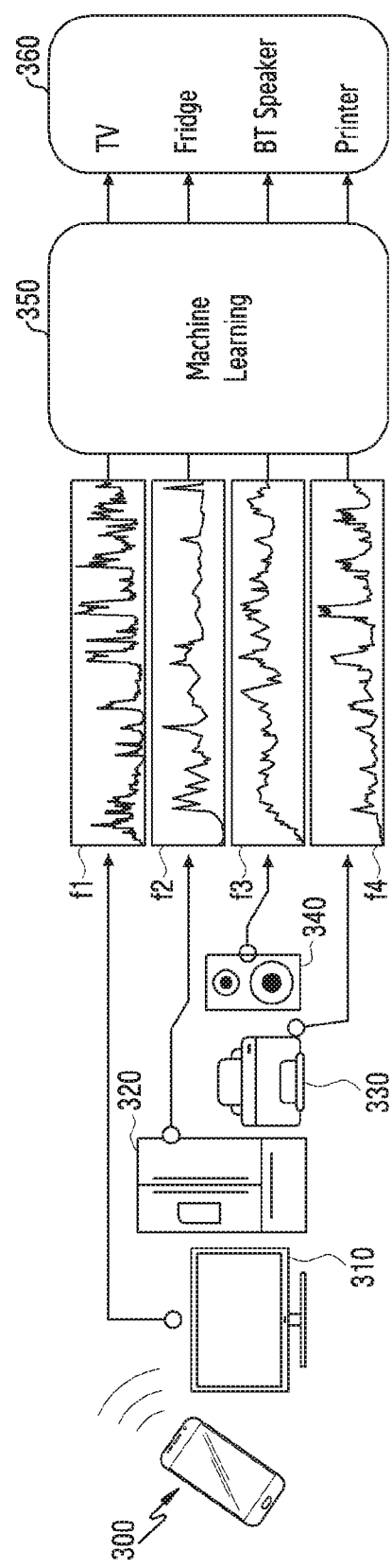
FIG. 3 is a diagram illustrating a procedure for classifying peripheral external electronic devices using a portable electronic device according to various embodiments of the present disclosure.
Figure 4A:
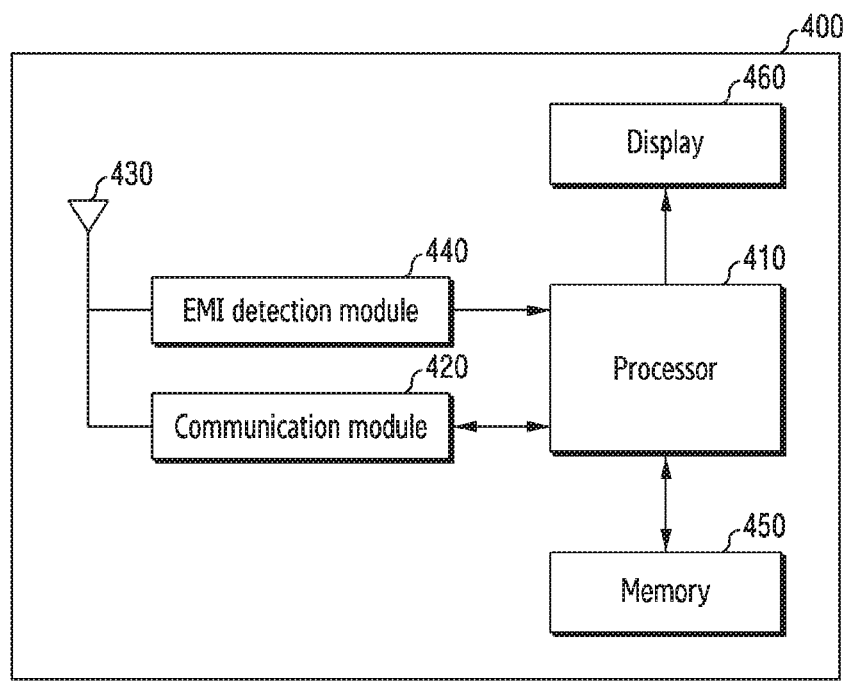
FIG. 4A is a block diagram illustrating an electronic device including an EMI detection module according to various embodiments of the present disclosure.

According to various embodiments, the electronic device 200 may include an EMI detection module (e.g., including EMI detection circuitry, e.g., an EMI detection module 440 of FIG. 4A) for detecting a unique signal (e.g., a low frequency less than or equal to 1 MHz) corresponding to EMI generated from an external electronic device when approaching the external electronic device (e.g., external electronic devices 310, 320, 330, and 340 of FIG. 3). According to an embodiment, the electronic device may include an antenna (e.g., an antenna 430 of FIGS. 4A and 4B) electrically coupled to the EMI detection module. According to an embodiment, the antenna may be used together with an antenna electrically coupled to the communication module of the electronic device or may be separately disposed in the electronic device. According to an embodiment, the electronic device may classify the external electronic device with only an operation of approaching an external electronic device, and may control the external electronic device by transitioning to a connectable state or activating to a connected state based on a characteristic of the classified external electronic device. Hereinafter, a detailed structure for EMI detection of the external electronic device will be described in greater detail below with reference to various figures.

FIG. 3 is a diagram illustrating a procedure for classifying peripheral external electronic devices using a portable electronic device according to various embodiments of the present disclosure.

An electronic device 300 of FIG. 3 may be at least partially similar to the electronic device 101 of FIG. 1 or the electronic device 200 of FIG. 2A, or may include other embodiments of the electronic device.

Referring to FIG. 3, a plurality of external electronic devices 310, 320, 330, and 340 may be disposed around (e.g., nearby) the electronic device 300. For example, the external electronic devices 310, 320, 330, and 340 may include a TV, a refrigerator, a Bluetooth speaker, or a printer. According to an embodiment, the external electronic devices 310, 320, 330, and 340 may have various electronic components (or sub components) included therein, and may include various frequency signals based on EMI generated from the electronic components. For example, the signal may include corresponding unique signals f1, f2, f3, and f4 less than or equal to 1 MHz. According to an embodiment, the electronic device may utilize a specific frequency band as classification information, and for example, may use a specific frequency in a frequency band less than or equal to 1 MHz as a unique frequency for recognizing an object depending on the EMI.

According to various embodiments, when the electronic device 300 approaches any one of the external electronic devices 310, 320, 330, and 340, the electronic device 300 may detect a unique signal depending on the aforementioned EMI via an EMI detection module (e.g., the EMI detection module 440 of FIG. 4A) and an antenna (e.g., the antenna 430 of FIGS. 4A and 4B), and after performing Machine Learning (ML) by extracting the detected signal (see 350), may output it by identifying or classifying the external electronic device (see 360). According to an embodiment, information on the classified external electronic device may be displayed via a display (e.g., the display 201 of FIG. 2A) of the electronic device 300. However, without being limited thereto, the information on the classified external electronic device may be output in an auditory manner.

According to various embodiments, the electronic device 300 may include a memory (e.g., the memory 130 of FIG. 1) which stores a signal table (e.g., a look-up table) including unique signals corresponding to various external electronic devices. However, without being limited thereto, the signal table may be stored in an external server (not shown) capable of communicating with the electronic device 300 via a network. The electronic device 300 may perform an operation of comparing with an EMI signal of the external electronic device detected through communication with the external server. In this case, the electronic device 300 may transmit detected signal information to the external server and thereafter receive classification information of the matched external electronic device from the external server.

According to various embodiments, the electronic device 300 may execute a specific application based on the classification information of the external device. For example, when the external electronic device is classified as a TV, the electronic device 300 may automatically establish connectivity (activate connectivity) with the TV while automatically executing an application related to a remote controller, and thus a user may allow the external electronic device to stand by in a state in which the external electronic device is controllable with only an operation of allowing the electronic device to approach the external electronic device, thereby increasing usability.

FIG. 4A is a block diagram illustrating an electronic device including an EMI detection module according to various embodiments of the present disclosure.

An electronic device 400 of FIG. 4A may be at least partially similar to the electronic device 101 of FIG. 1 or the electronic device 200 of FIG. 2A or the electronic device 300 of FIG. 3, or may include other embodiments of the electronic device.

Referring to FIG. 4A, the electronic device 400 may include a processor (e.g., including processing circuitry) 410, a communication module (e.g., including communication circuitry) 420, an EMI detection module (e.g., including EMI detection circuitry) 440, a memory 450, an antenna 430, and a display 460.

According to various embodiments, the communication module 420 may include various communication circuitry and support a wired or wireless communication channel established between the electronic device 400 and an external electronic device (e.g., the electronic device 102, electronic device 104, or server 108 of FIG. 1) via the antenna 430 or communication performed via the established communication channel. According to an embodiment, the communication module 420 may support communication performed for connectivity with at least one external electronic device among the external electronic devices 310, 320, 330, and 340 based on the classification of an EMI signal via the antenna 430.

According to various embodiments, the EMI detection module 440 may include various detection circuitry and detect a unique signal of an external electronic device (e.g., the external electronic devices 310, 320, 330, and 340 of FIG. 3) via the antenna 430 and provide corresponding information to a processor.

According to various embodiments, the memory 450 may store a table including information on unique signals of external electronic devices, stored after ML learning, or pre-set unique signals of the external electronic devices. According to an embodiment, the table may include a look-up table including regenerated items to map specific values for respective unique signals so that a corresponding program is accessible quickly.

According to various embodiments, the processor 410 may include various processing circuitry and control the EMI detection module 440 for detecting a unique signal (e.g., a low-frequency signal less than or equal to 1 MHz) corresponding to EMI generated from the external electronic device by approaching the external electronic device (e.g., the external electronic devices 310, 320, 330, and 340). According to an embodiment, the processor 410 may classify the external electronic device simply with an operation of approaching the external electronic device, and may control the external electronic device by transitioning to a connectable state or activating to a connected state based on a characteristic of the classified external electronic device. According to an embodiment, after classifying the external electronic device using a signal provided from the EMI detection module 440, the display 460 may be controlled to display corresponding information of the classified external electronic device.

Figure 4B:
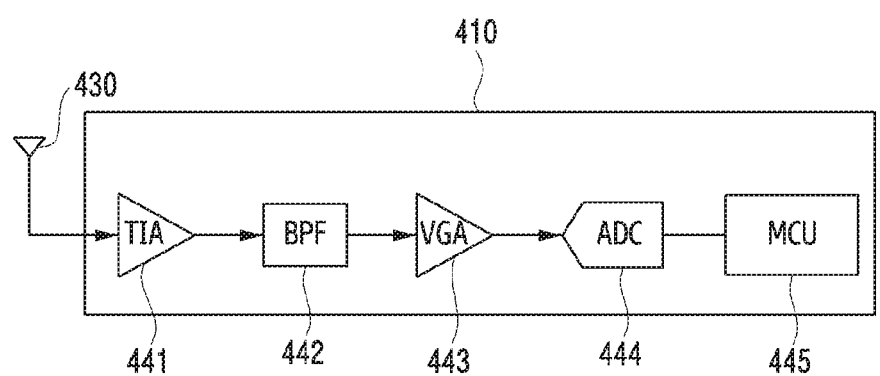
FIG. 4B is a diagram illustrating a structure of an EMI detection module of FIG. 4A according to various embodiments of the present disclosure.

FIG. 4B is a diagram illustrating a structure of an EMI detection module of FIG. 4A according to various embodiments of the present disclosure.

Referring to FIG. 4B, the EMI detection module 440 may include various circuitry, such as, for example, and without limitation, a TransImpedance Amplifier (TIA) 441, a Band Pass Filter (BPF) 442, a Variable Gain Amplifier (VGA) 443, an Analog Digital Converter (ADC) 444, and a Micro Controller Unit (MCU) (e.g., including micro controller circuitry) 445.

According to an embodiment, the antenna 430 may have a reception bandwidth capable of receiving an EMI signal. The TIA 441 may amplify a frequency signal less than or equal to 1 MHz, received from the antenna 430. According to an embodiment, the BPF 442 may filter the signal amplified and received from the TIA 441 to the vicinity of a specific signal of interest which defines a specific pattern. According to an embodiment, the VGA 443 may output a signal to a specific level across a pre-set gain range in order to improve a noise feature of the filtered signal and a cancellation feature of an external interference signal. According to an embodiment, the ADC 444 may convert an analog signal provided from the VGA 443 into a digital signal and thereafter provide it to the MCU 445.

According to various embodiments, the MCU 445 may perform comparison with a signal table stored in the electronic device 400 using a signal converted with an optimal condition, and thereafter may classify an external electronic device and provide classification information to the processor 410 of the electronic device 400. However, without being limited thereto, the MCU 445 may directly provide the provided signal information to the processor 410 of the electronic device 400. In this case, the classifying of the external electronic device through the signal comparison may be performed in the processor of the electronic device.

According to various embodiments, the electronic device 400 may need to minimize and/or reduce noise generated autonomously in the electronic device 400 to detect an optimal input signal waveform. According to an embodiment, in order to minimize and/or reduce an input error, the electronic device may recognize internal noise caused by a touch screen input, and thereafter may detect a distorted waveform depending on a gripping type when applying a compensation algorithm and configuring a plurality of antennas. For example, according to various conditions of the electronic device such as a user's gripping state or the like of the electronic device, EMI detection information may be different from original unique EMI detection information of the external electronic device. According to an embodiment, the electronic device may compare a measurement value and the unique EMI detection information of the external electronic device and may persistently collect the information. According to an embodiment, the collected information may be utilized to subsequent correct EMI detection by discovering a correlation for the EMI detection information through big data analysis. The big data analysis may include a technique such as, for example, and without limitation, a regression analysis, a clustering and/or association analysis, or the like.

Figure 5A:
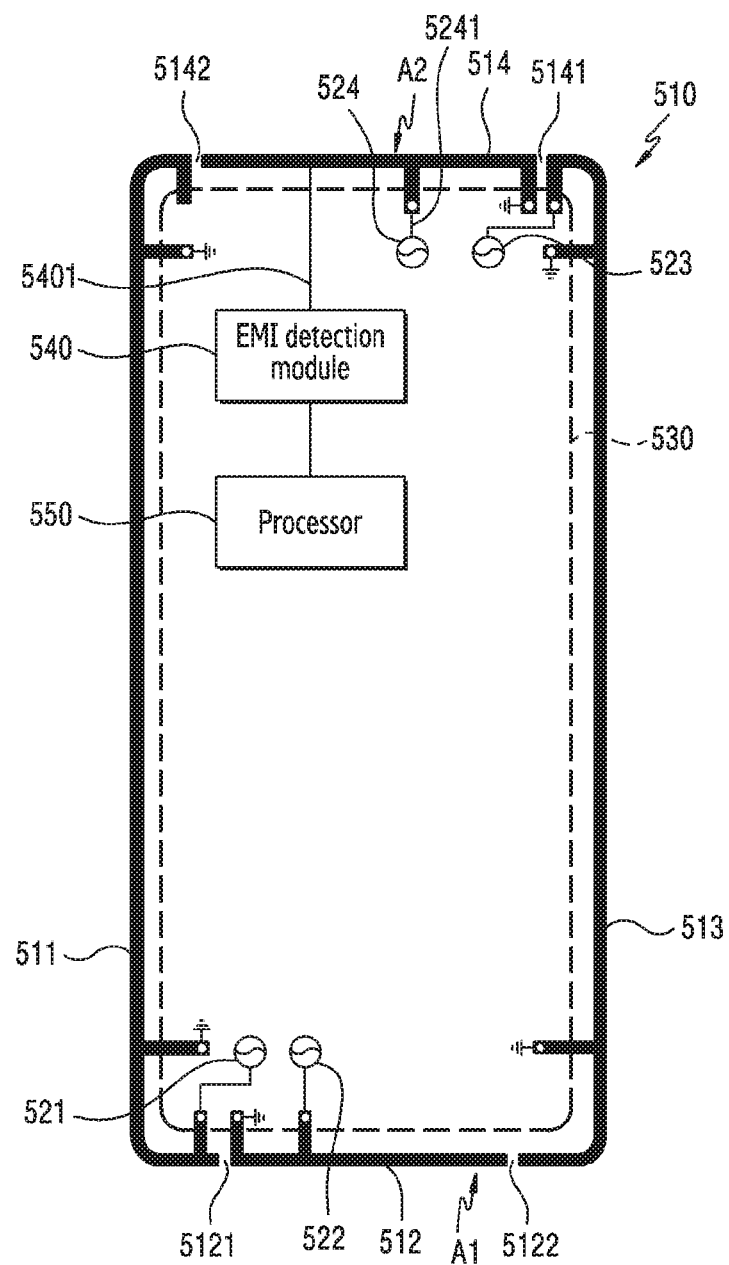
FIG. 5A is a diagram illustrating a structure of an antenna of a portable electronic device according to various embodiments of the present disclosure.

FIG. 5A is a diagram illustrating a structure of an antenna of a portable electronic device according to various embodiments of the present disclosure.

A housing 510 of FIG. 5A may be at least partially similar to the housing 210 of FIG. 2A, or may include other embodiments of the housing.

Referring to FIG. 5A, the housing 510 included in an electronic device (e.g. the electronic device 200 of FIG. 2A) may be constructed of at least a conductive member. According to an embodiment, the housing 510 may be constructed in such a manner that a conductive member and a non-conductive member are double injected. According to an embodiment, at least part of the housing 510 may be disposed to be exposed along a boundary of the electronic device.

According to various embodiments, the housing 510 constructed of the conductive member may include a first lateral side 511 having a first length, a second lateral side 512 extended from the first lateral side 511 in a vertical direction and having a second length, a third lateral side 513 extended from the second lateral side 512 to have the first length in parallel with the first lateral side 511, and a fourth lateral side 514 extended from the third lateral side 513 to have the second length in parallel with the second lateral side 512. According to an embodiment, the first lateral side 511, the second lateral side 512, the third lateral side 513, and the fourth lateral side 514 may be constructed in an integral manner. According to an embodiment, the first length may be constructed to be longer than the second length.

According to various embodiments, the second lateral side 512 may be constructed as the unit conductive segment 512 electrically separated by a pair of non-conductive segments 5121 and 5122 separated with a specific interval. In addition, the fourth lateral side 514 may also be constructed as the unit conductive segment 514 electrically separated by a pair of non-conductive segments 5141 and 5142 separated with a specific interval. According to an embodiment, at least one of the conductive segments 511, 512, 513, and 514 electrically separated by the non-conductive segments 5121, 5122, 5141, and 5142 may be utilized as an antenna operating in at least one resonance frequency band by being electrically coupled with wireless communication modules 521, 522, 523, and 524 disposed to a substrate (or a PCB) of the electronic device. For example, the second lateral side 512 may be constructed as a first antenna portion A1 operating in a low-band, and the fourth lateral side 514 may be constructed as a second antenna portion A2 operating in a mid-band and a high-band. According to an embodiment, the antenna may be constructed in the first lateral side 511 and/or the third lateral side 513, but the antenna is not limited to such a construction.

According to various embodiments, an EMI detection module 540 may be electrically coupled to a conductive member (e.g., the fourth lateral side 514) of the housing 510 used as any one of first and second antenna portions A1 and A2. According to an embodiment, the EMI detection module 540 may not be affected by a user's gripping or the like, and may be electrically coupled to the fourth lateral side 514 which is most advantageous to be in contact with or to approach the external electronic device. According to an embodiment, the EMI detection module 540 may be electrically coupled to the fourth lateral side 514 by being branched from the communication module 524 on an electrical path 5241. According to an embodiment, the EMI detection module 540 may be used in common as an antenna radiator for communication and an antenna radiator for EMI detection. In this case, the EMI detection module 540 may detect a unique signal of EMI of a peripheral external device using the fourth lateral side 514, and may provide information related to the detected signal to a processor 550 of the electronic device.

Figure 5B:
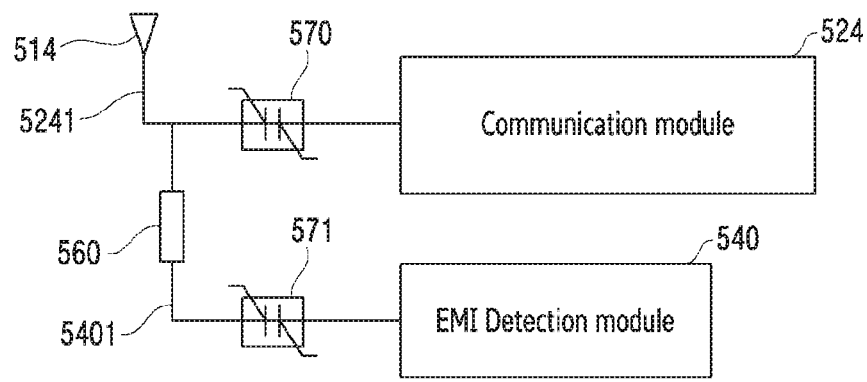
FIG. 5B and FIG. 5C are diagrams illustrating a structure of a state in which an antenna of a portable electronic device is used together as an antenna element for EMI detection according to various embodiments of the present disclosure.
Figure 5C:
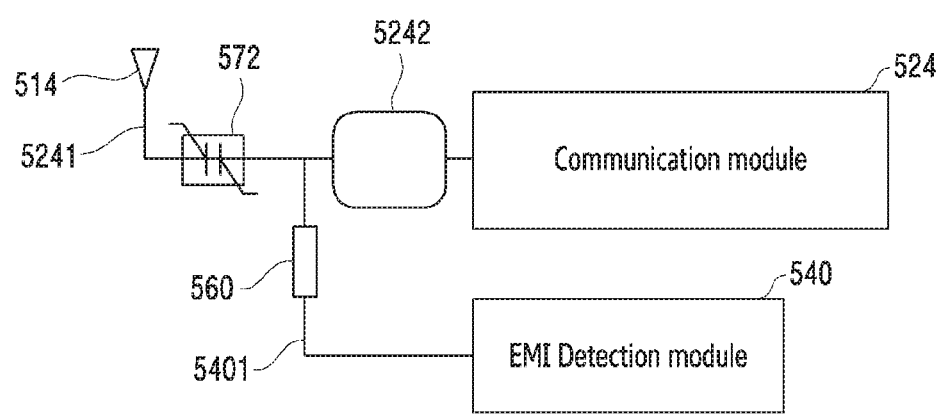

FIG. 5B and FIG. 5C are diagrams illustrating a structure of a state in which an antenna of a portable electronic device is used together as an antenna element for EMI detection according to various embodiments of the present disclosure.

Referring to FIG. 5B, the EMI detection module 540 may be coupled in common with a conductive fourth lateral side electrically coupled with a communication module. According to an embodiment, the EMI detection module 540 may be electrically coupled with the fourth lateral side 514 using a second electronic path 5401 branched on the first electronic path 5241 for electrically connecting the communication module 524 with the fourth lateral side 514. According to an embodiment, electric shock prevention circuits 570 and 571 may be disposed on the first electronic path 5241 and the second electronic path 5401. According to an embodiment, the electric shock prevention circuit may include at least one capacitor having a specific capacitance value. According to an embodiment, the electric shock prevention circuits 570 and 571 may perform an Electro-Static Discharge (ESD) function for discharging static electricity since the fourth lateral side 514 is constructed of a metallic member constituting at least part of an exterior of the electronic device and is physically in contact directly with a substrate (e.g., a substrate 530 of FIG. 5A).

According to various embodiments, the second electrical path 5401 may start between the fourth lateral side 514 and the electric shock prevention circuit 570 on the first electrical path 5241. According to an embodiment, at least one filtering member 560 may be disposed on the second electrical path 5401. According to an embodiment, the filtering member 560 may be disposed between the fourth lateral side 514 and the electric shock prevention circuit 571. According to an embodiment, the filtering member 560 may separate a signal received from the fourth lateral side 514 and thus may induce the EMI detection module 540 to detect this. According to an embodiment, the signal may include a unique frequency signal corresponding to EMI less than or equal to 1 MHz. According to an embodiment, the filtering member 560 may include at least one inductor. According to an embodiment, the inductor may include an inductor value of 100 nH. However, without being limited thereto, a filtering value of the filtering member 560 may be designed to be in a proper range through experiments and considering a characteristic of the electronic device for separating a high frequency and a low frequency.

As illustrated in FIG. 5C, at least one matching circuit 5242 may be further disposed on the first electrical path 5241. In this case, an electric shock prevention circuit 572 may be disposed between the fourth lateral side 514 and the matching circuit 5242, and the second electrical path 5401 may start between the electric shock prevention circuit 572 and the matching circuit 5242 on the first electrical path 5241. According to an embodiment, the matching circuit 5242 may ensure frequency detection performance for communication, and may operate for a shift of a proper bandwidth. According to an embodiment, the matching circuit 5242 may include at least one passive element (e.g., a capacitor, an inductor, etc.).

Figure 6:
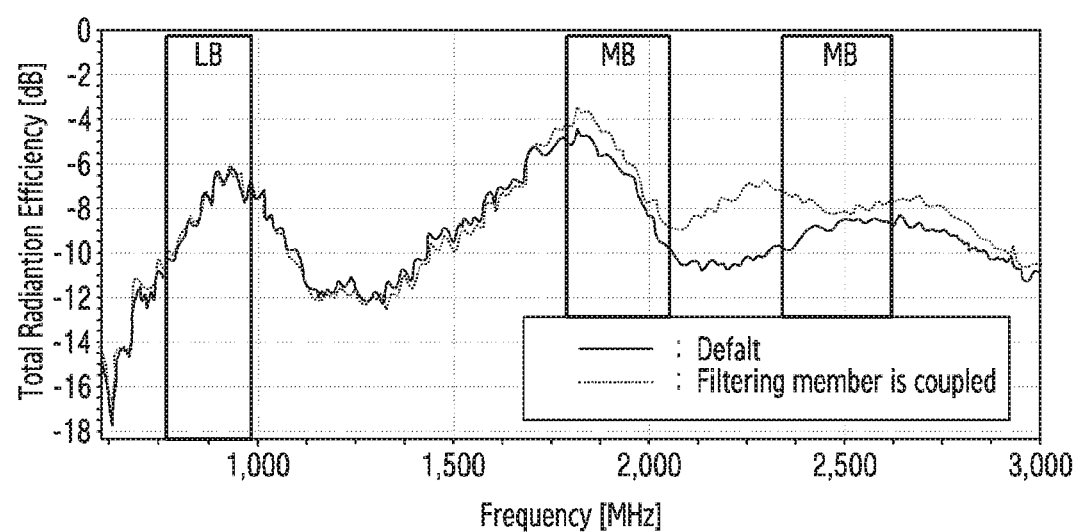
FIG. 6 is a graph illustrating radiation efficiency of an antenna depending on the structure of FIG. 5A and/or FIG. 5B according to various embodiments of the present disclosure.

FIG. 6 is a graph illustrating radiation efficiency of an antenna depending on the structure of FIG. 5A and/or FIG. 5B according to various embodiments of the present disclosure. It can be seen that the radiation efficiency of the antenna (e.g., the antenna of FIG. 5C) maintains the same performance across a full band of a low band, a mid band, and a high band when an EMI detection module (e.g., the EMI detection module 540 of FIG. 5C) for EMI detection is not coupled and when the EMI detection module is separated from a first electrical path (e.g., the first electrical path 5241 of FIG. 5C) using a second electrical path (e.g., the second electrical path 5401 of FIG. 5C). Such a result implies that there is no problem in radiation performance of an antenna for communication since the second electrical path is branched on the first electrical path connecting the antenna and the communication module so that an element having a proper value is provided even in case of being electrically coupled with the EMI detection module, and implies that the electronic device does not have to use an additional antenna for detecting a unique signal of EMI, thereby facilitating to make the electronic device slim.

Figure 7:
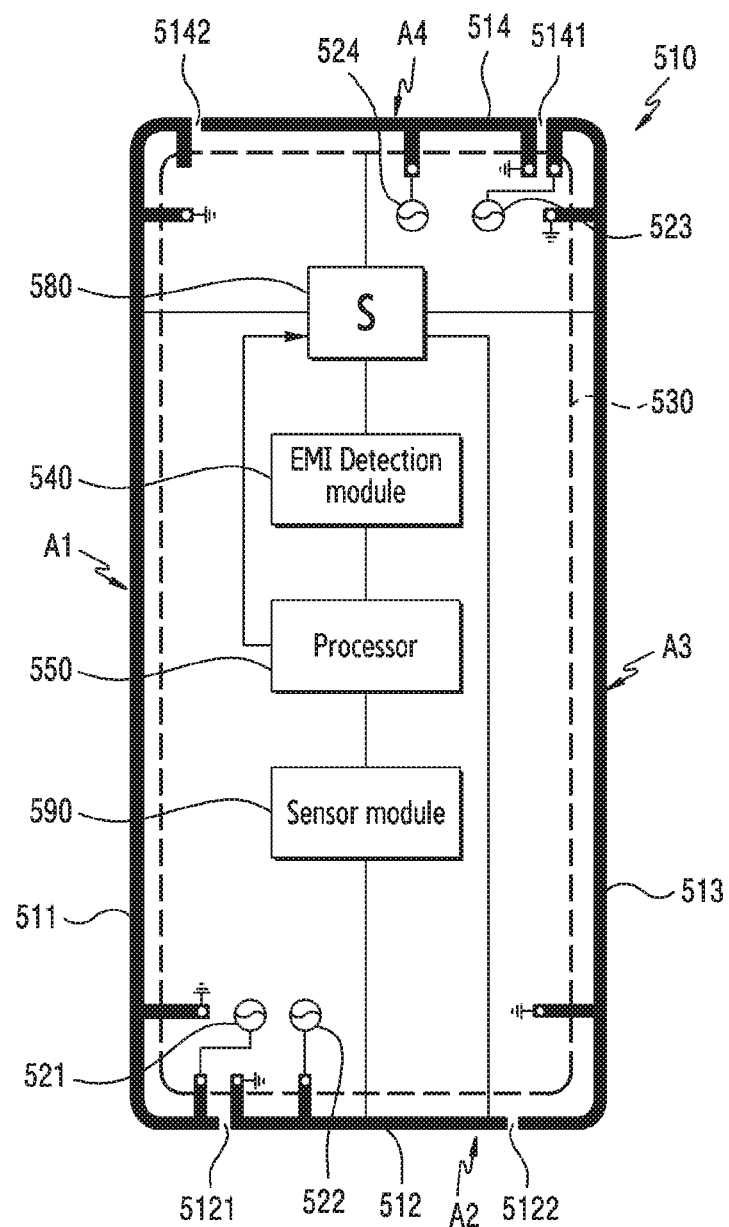
FIG. 7 is a diagram illustrating a structure of an antenna of a portable electronic device according to various embodiments of the present disclosure.

FIG. 7 is a diagram illustrating a structure of an antenna of a portable electronic device according to various embodiments of the present disclosure.

A housing 510 of FIG. 7 may be at least partially similar to the housing 210 of FIG. 2A, or may include other embodiments of the housing. A structure of the housing of FIG. 7 is similar to the structure of the housing of FIG. 5A, and it is illustrated that an EMI detection module is configured to be electrically coupled selectively with at least one lateral side among a plurality of conductive lateral sides via a switching member. Accordingly, descriptions on lateral sides of the housing and a communication circuit to be electrically coupled thereto may be omitted.

Referring to FIG. 7, a switching member (e.g., including a switch) 580 may be coupled to a first lateral side 511, second lateral side 512, third lateral side 513, and fourth lateral side 514 used as an antenna radiator for communication. According to an embodiment, the switching member 580 may be electrically coupled with an EMI detection module 540, and may perform a switching operation such that only a specific lateral side of the housing is connected under the control of a processor 550.

According to various embodiments, the processor 550 may be electrically coupled to a sensor module 590 for detecting an external environment of the electronic device. According to an embodiment, the sensor module may include a grip sensor module 590. According to an embodiment, the processor 550 may detect a state in which the electronic device is gripped by a user, and may maximize a recognition rate by detecting a distorted waveform depending on a gripping type or by distinguishing an optimal waveform of each lateral side used as an antenna. For example, the processor 550 may use detection information of the grip sensor module 590 to detect a touch made by the user on a specific region of the electronic device, and may control the switching member 580 to selectively operate a lateral side of the housing operating as a corresponding antenna. According to an embodiment, the processor 550 may correct a signal value related to EMI detected from a corresponding lateral side by applying a noise value learned in advance.

Figure 8:
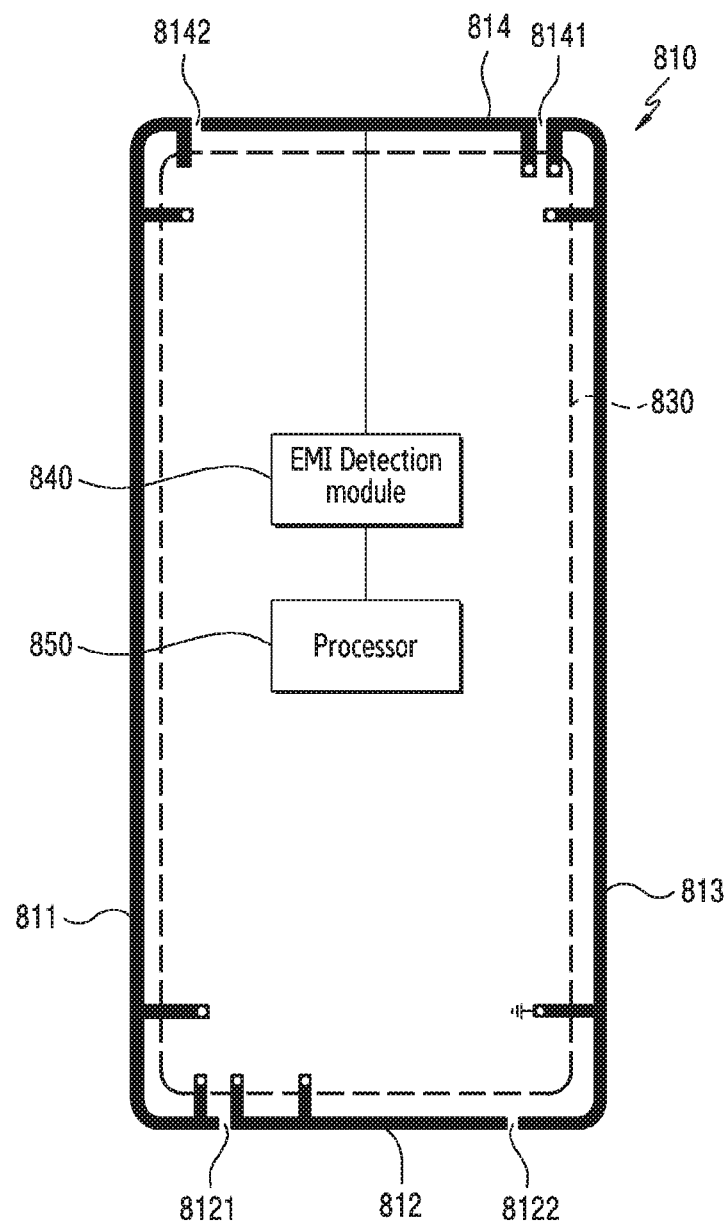
FIG. 8 is a diagram illustrating a structure of an antenna for EMI detection of a portable electronic device according to various embodiments of the present disclosure.

FIG. 8 is a diagram illustrating a structure of an antenna for EMI detection of a portable electronic device according to various embodiments of the present disclosure.

A housing 810 of FIG. 8 may be at least partially similar to the housing 210 of FIG. 2A, or may include other embodiments of the housing.

Referring to FIG. 8, the housing 810 included in an electronic device (e.g. the electronic device 200 of FIG. 2A) may be constructed of at least a conductive member. According to an embodiment, the housing 810 may be constructed in such a manner that a conductive member and a non-conductive member are double injected. According to an embodiment, at least part of the housing 810 may be disposed to be exposed along a boundary of the electronic device.

According to various embodiments, the housing 810 constructed of a metallic member may include a first lateral side 811 having a first length, a second lateral side 812 extended from the first lateral side 811 in a vertical direction and having a second length, a third lateral side 813 extended from the second lateral side 812 to have the first length in parallel with the first lateral side 811, and a fourth lateral side 814 extended from the third lateral side 813 to have the second length in parallel with the second lateral side 812. According to an embodiment, the first lateral side 811, the second lateral side 812, the third lateral side 813, and the fourth lateral side 814 may be constructed in an integral manner. According to an embodiment, the first length may be constructed to be longer than the second length.

According to various embodiment, an electronic device (e.g., the electronic device 200 of FIG. 2A) may include a substrate 830, and the substrate 830 may include a processor 850 and an EMI detection module 840 coupled with the processor 850. According to an embodiment, the housing 810 may include an additional antenna element prepared to detect a unique signal for EMI generated from an external electronic device. According to an embodiment, the antenna element may use at least one lateral side electrically disconnected among lateral sides 811, 812, 813, and 814 of the housing 810.

According to various embodiments, the second lateral side 812 may be constructed as the unit conductive segment 812 electrically separated by a pair of non-conductive segments 8121 and 8122 separated with a specific interval. In addition, the fourth lateral side 814 may also be constructed as the unit conductive segment 814 electrically separated by a pair of non-conductive segments 8141 and 8142 with a specific interval. According to an embodiment, the fourth lateral side 814 among the conductive segments 811, 812, 813, and 814 electrically separated by the non-conductive segments 8141 and 8142 may operate as an antenna for individual frequency detection corresponding to EMI by being electrically coupled with the EMI detection module 840.

Figure 9A:
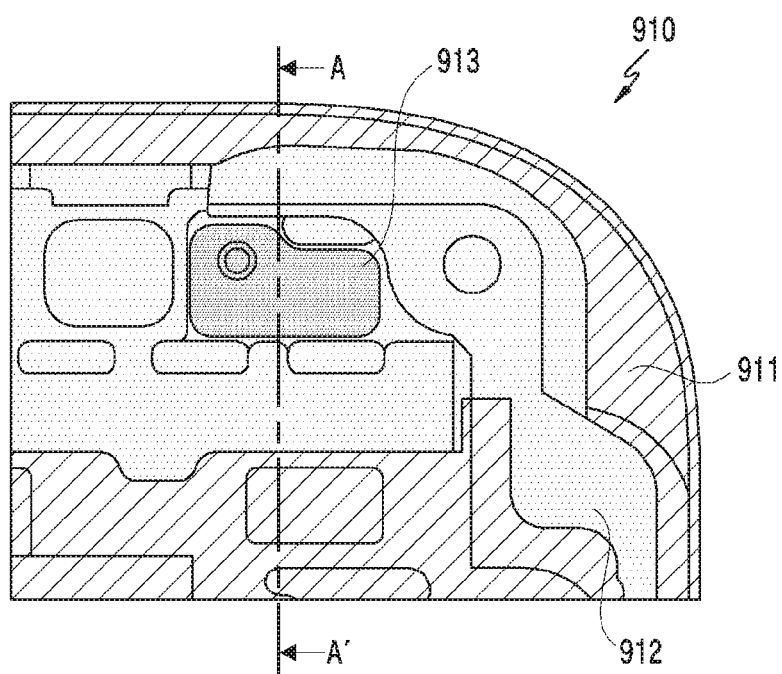
FIG. 9A and FIG. 9B are diagrams illustrating a structure of an antenna for EMI detection, disposed to a portable electronic device, according to various embodiments of the present disclosure.
Figure 9B:
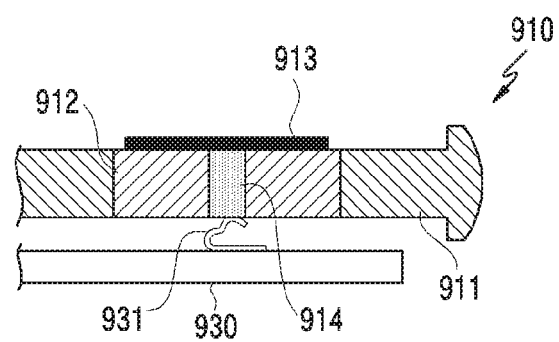

FIG. 9A and FIG. 9B are diagrams illustrating a structure of an antenna for EMI detection, disposed to a portable electronic device, according to various embodiments of the present disclosure.

Referring to FIG. 9A, an antenna 913 for detecting a signal depending on EMI may be disposed inside a housing 910. According to an embodiment, the housing 910 may be constructed of a conductive member 911 and a non-conductive member 912. According to an embodiment, the antenna 913 may be disposed to the non-conductive member 912. According to an embodiment, the antenna 913 may be used alone by being disposed to the non-conductive member 912, or may be used together by being electrically coupled with a peripheral antenna (e.g., a conductive lateral side of the housing).

According to various embodiments, the antenna 913 may be disposed to an outer surface of the non-conductive member or may be disposed in an attached manner. According to an embodiment, the antenna 913 may be implemented in, for example, and without limitation, a Laser Direct Structuring (LDS) type, Thin Film Antenna type, Flexible Printed Circuit Board (FPCB) type, Steel Use Stainless (SUS) type, or the like, disposed to the non-conductive member 912. According to an embodiment, the antenna for detecting the signal depending on EMI may be used in common with the aforementioned communication antenna used by being disposed to the non-conductive member 912.

FIG. 9B is a cross-sectional view illustrating a state of being cut along the line A-A' of FIG. 9A.

Referring to FIG. 9B, the housing 910 may be constructed of the conductive member 911 and the non-conductive member 912. According to an embodiment, the antenna 913 may be disposed to one side of the non-conductive member 912 while maintaining an electrically disconnected state. According to an embodiment, a metal filler (or metal island) 914 may be disposed to the non-conductive member 912 in a penetrated manner. According to an embodiment, the antenna 913 may be disposed to be in contact with one end of the metal filler 914. According to an embodiment, the other end of the metal filler 914 may be electrically coupled with a substrate 930 disposed to the other side of the non-conductive member 912 by means of an electrical connecting member 931 (e.g., a C-clip or a conductive spring).

Figure 10:
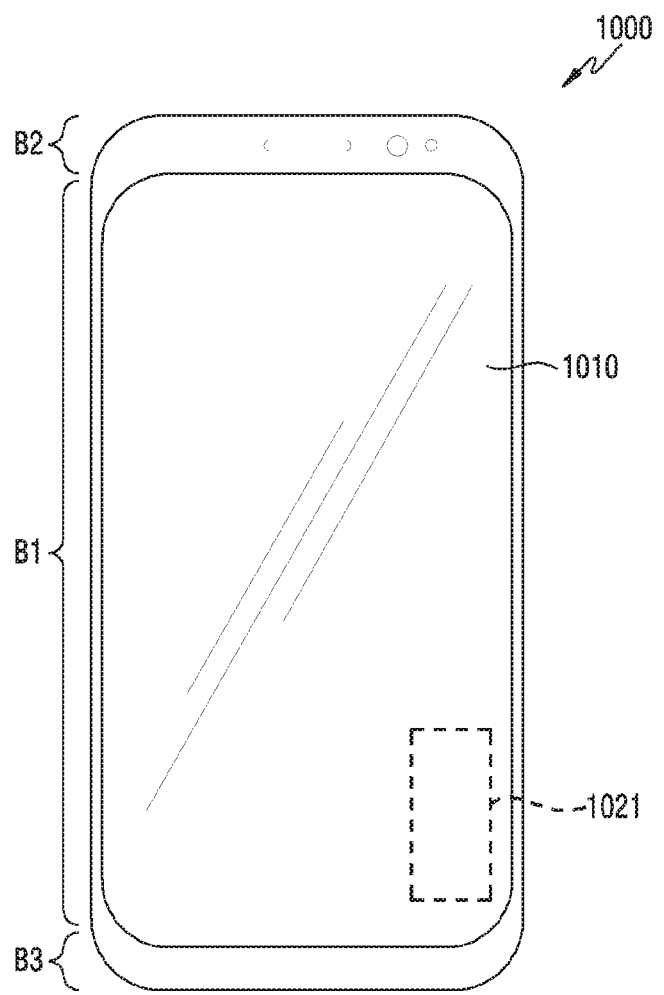
FIG. 10 is a diagram illustrating a state in which an antenna for EMI detection is disposed to a front side of a portable electronic device according to various embodiments of the present disclosure.

FIG. 10 is a diagram illustrating a state in which an antenna for EMI detection is disposed to a front side of a portable electronic device according to various embodiments of the present disclosure.

An electronic device 1000 of FIG. 10 may be at least partially similar to the electronic device 101 of FIG. 1 or the electronic device 200 of FIG. 2A, or may include other embodiments of the electronic device.

Referring to FIG. 10, the electronic device 1000 may include a display 1010 disposed to a front side thereof. According to an embodiment, the electronic device 1000 may include a display region B1 and BM (black matrix)(or inactive region) regions B2 and B3. According to an embodiment, the display 1010 may include a front plate (e.g., the front plate 2011 of FIG. 2A) and a display module (e.g., a liquid crystal display) disposed to a rear side of the front plate 2011.

According to various embodiments, an antenna 1021 for detecting a signal may be disposed to at least part of a display region using a transparent electrode (e.g., an Indium Tin Oxide (ITO) electrode). According to an embodiment, the antenna 1021 may be disposed between the front plate and the display module. According to an embodiment, the antenna 1021 may be implemented using an additional transparent electrode, or may be used in common using a touch sensing transparent electrode disposed for touch sensing in a display region B1. According to an embodiment, the antenna 1021 using the transparent electrode may be disposed to the display region B1, or may be disposed through BM regions B2 and B3 extended from the display region. Although not shown, the antenna may be electrically coupled to a substrate using the touch sensor and/or the connector of the display in common.

Figure 11A:
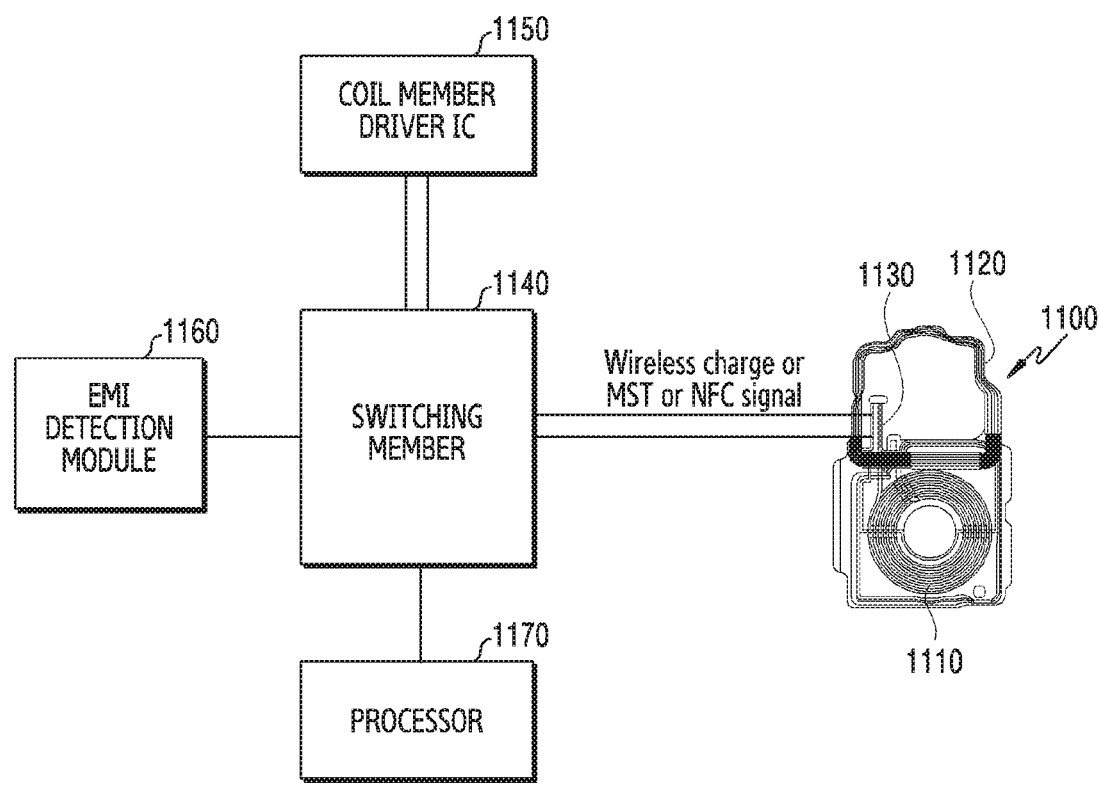
FIG. 11A and FIG. 11B are diagrams illustrating a structure of a coil-type antenna member of a portable electronic device according to various embodiments of the present disclosure.
Figure 11B:
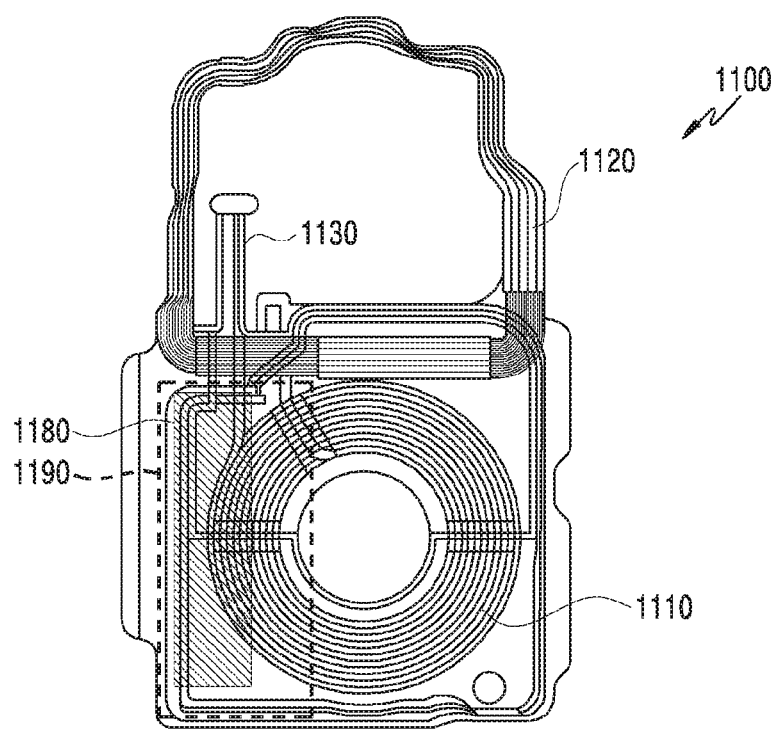

FIG. 11A and FIG. 11B are diagrams illustrating a structure of a coil-type antenna member of a portable electronic device according to various embodiments of the present disclosure.

Referring to FIG. 11A, an electronic device (e.g., the electronic device 101 of FIG. 1 or the electronic device 200 of FIG. 2A) may have a coil member 1100 wound in various ways inside the electronic device as an antenna element. According to an embodiment, the coil member 1100 may include a wireless charging coil member 1110 and a short-range communication coil member 1120. According to an embodiment, the coil member 1100 may be used as an antenna for performing Magnetic Secure Transmission (MST), wireless charging, or Near Field Communication (NFC) functions of the electronic device.

According to various embodiments, the coil member 1100 may be used in common as an antenna element for EMI signal detection. According to an embodiment, the coil member 1100 may be electrically coupled with a switching member (e.g., including a switch) 1140 via a connector 1130. According to an embodiment, the connector 1130 may be electrically coupled with a coil member driver IC 1150 and an EMI detection module 1160 via the switching member 1140. According to an embodiment, a processor 1170 may detect a current state of the electronic device, and may control the switching member 1140 based on the detected current state to determine the aforementioned function of the coil member 1100. For example, upon detecting that the electronic device is being wirelessly charged or that a short-range communication operation is performed, the processor 1170 may couple the connecter 1130 to the coil member driver IC 1150 via the switching member 1140 to induce the coil member 1100 to operate as an antenna for the wireless charging or the short-range communication operation. According to an embodiment, upon detecting that the electronic device does not perform wireless charging, MST, or NFC functions or upon detecting a user's intention of detecting an EMI signal of peripheral external electronic devices, the processor 1170 may couple the connector 1130 to the EMI detection module 1160 via the switching member 1140 to induce the coil member 1100 to operate as an antenna for detecting the EMI signal.

Referring to FIG. 11B, an antenna 1180 for detecting an EMI signal may be individually disposed to be at least partially overlap with the coil member. In this case, a shieling member 1190 may be disposed between the antenna 1180 and the coil member 1100 to shield mutual interference. According to an embodiment, the shielding member 1190 may include a ferrite sheet. According to an embodiment, the shieling member 1190 may be disposed to have at least a greater area than an area in which the antenna 1180 for detecting the EMI signal and the coil member 1100 overlap.

Figure 12A:
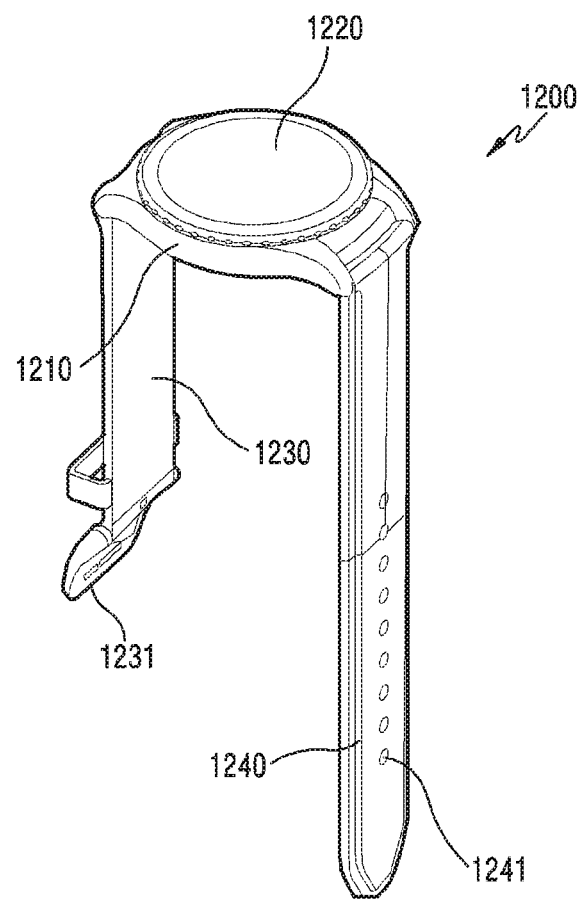
FIG. 12A and FIG. 12B are diagrams illustrating a structure of an antenna disposed to a wearable electronic device according to various embodiments of the present disclosure.
Figure 12B:
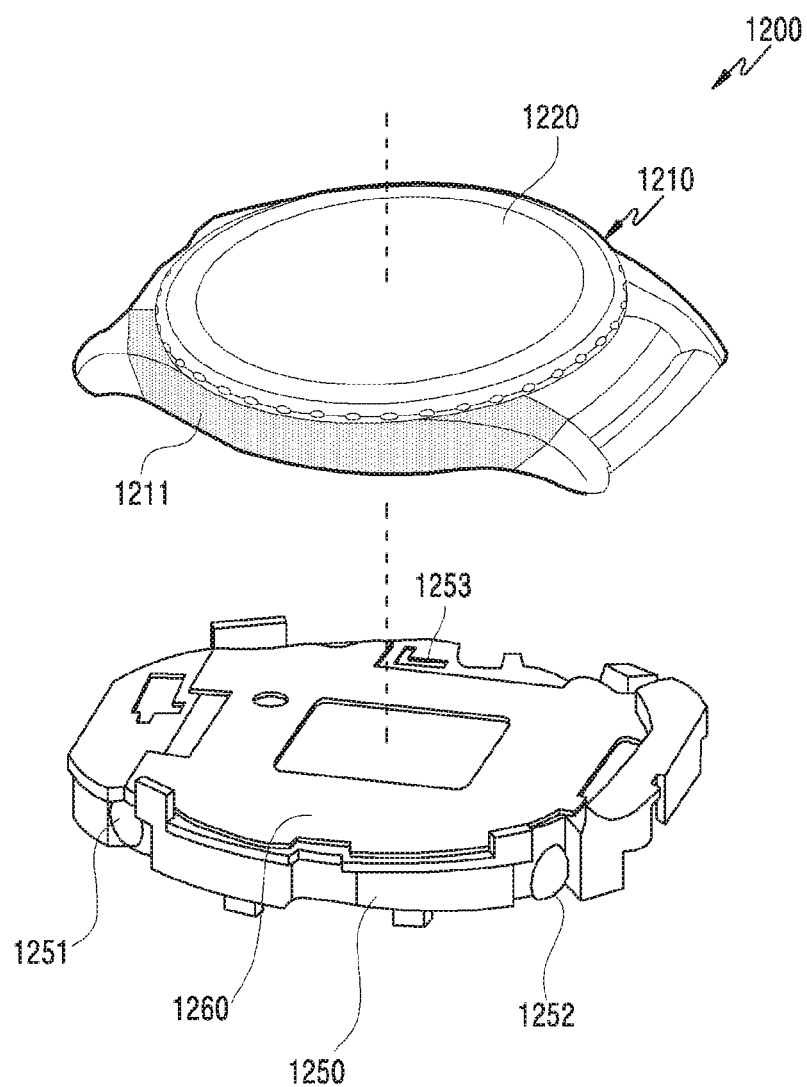

FIG. 12A and FIG. 12B are diagrams illustrating a structure of an antenna disposed to a wearable electronic device according to various embodiments of the present disclosure.

Referring to FIG. 12A, a wearable electronic device 1200 may include a wrist-wearable electronic device. According to an embodiment, the wearable electronic device 1200 may include a housing 1210 (e.g., a main body) including a display 1220, and a pair of straps 1230 and 1240 (e.g., a connecting portion) having a specific length and disposed rotatably at one end and the other end of the housing 1210. According to an embodiment, at least part of the housing 1210 may be constructed of a conductive segment (e.g., a conductive segment 1211 of FIG. 12B). According to an embodiment, a buckle member 1231 may be disposed to an end portion of the first strap 1230, and a plurality of openings 1241 disposed with a specific interval and capable of being joined with the buckle member 1231 may be included in the second strap 1240. According to an embodiment, the wearable electronic device 1200 may be worn using the buckle member 1231 and the opening 1241 in such a manner that a wrist is wound by the first strap 1230 and the second strap 1240 in a state in which the housing 1210 is placed on a user's wrist.

Referring to FIG. 12B, the wearable electronic device 1200 may include a communication circuit, and the communication circuit may be used as an antenna by being electrically coupled to the conductive segment 1211 of the housing 1210. According to an embodiment, the wearable electronic device 1200 may include an EMI detection module (e.g., the EMI detection module 440 of FIG. 4) for detecting an EMI signal to classify an external electronic device. According to an embodiment, the conductive segment 1211 of the housing 1210 may be electrically coupled with at least one of connection terminals 1251 and 1252 of a substrate 1260 included in a bracket 1250 mounted to the housing 1210. According to an embodiment, the connection terminal may include the connection terminal 1251 for feeding and the connection terminal 1252 for grounding.

According to various embodiments, the conductive segment 1211 may be coupled in common with the EMI detection module. In this case, as described above, a filtering member (e.g., the filtering member 560 of FIG. 5B) for filtering an EMI signal may be disposed on an electrical path of the EMI detection module, and a matching circuit (e.g., the matching circuit 5242 of FIG. 5C) for preventing radiation performance deterioration of an antenna (e.g., the conductive segment 1211) may also be additionally disposed. However, without being limited thereto, the EMI detection module may be electrically coupled via an additional antenna 1253 disposed to the bracket 1250. According to an embodiment, the antenna 1253 disposed to the bracket 1250 constructed of a non-conductive material may be implemented in, for example, and without limitation, a Laser Direct Structuring (LDS) type, a Thin Film Antenna (TFA) type, a Flexible Printed Circuit Board (FPCB) type, a Steel Use Stainless (SUS) type, or the like.

Figure 13:
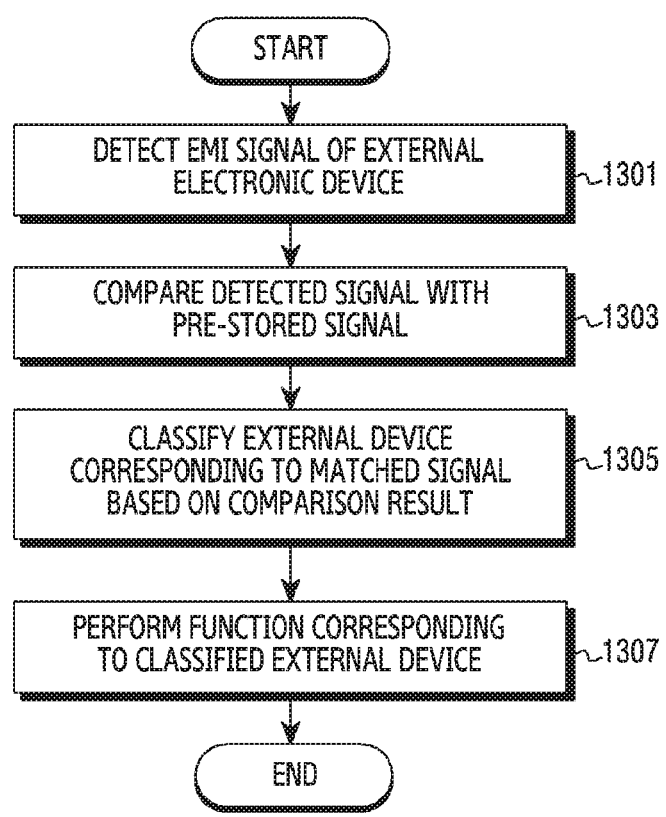
FIG. 13 is a flowchart illustrating a procedure of a portable electronic device for classifying an external electronic device using a unique signal of EMI detected from an external electronic device and for performing a corresponding function according to various embodiments of the present disclosure.

FIG. 13 is a flowchart illustrating a procedure of a portable electronic device for classifying an external electronic device using a unique signal of EMI detected from an external electronic device and for performing a corresponding function according to various embodiments of the present disclosure.

Referring to FIG. 13, in operation 1301, an electronic device (e.g., the electronic device 300 of FIG. 3) may detect an EMI signal (or waveform) of an external electronic device (e.g., the external electronic devices 310, 320, 330, and 340 of FIG. 3). According to an embodiment, the electronic device may detect an EMI signal of the external electronic device with simply an operation of approaching or being in contact with the external electronic device to be classified. According to an embodiment, as an antenna element for detecting the EMI signal, the electronic device may include an antenna (e.g., the conductive segment 514 of FIG. 5A) to be used in common with an antenna element for communication. According to an embodiment, the electronic device may include an antenna disposed individually to detect the EMI signal. According to an embodiment, the electronic device may be provided with a unique signal from an EMI detection module (e.g., the EMI detection module 440 of FIG. 4) electrically coupled with at least one of the aforementioned antennas. According to an embodiment, the electronic device may detect a frequency characteristic by detecting the EMI signal.

In operation 1303, the electronic device may compare a signal table (e.g., a look-up table) including a pre-stored unique signal corresponding to a plurality of external devices with frequency information of the EMI signal of an external electronic device, received (or provided) from the EMI detection module 440. According to an embodiment, a plurality of different unique signals included in the signal table may include a signal improved through ML learning. According to an embodiment, the electronic device may identify whether the provided signal is matched to any one signal among a plurality of signals existing in the signal table.

In operation 1305, the electronic device may classify an external electronic device mapped to a matched signal based on the comparison result. Information on the classified external electronic device may be output through a display (e.g., the display 201 of FIG. 2A) of the electronic device. However, without being limited thereto, the information on the classified external electronic device may also be output in an auditory manner via a speaker (e.g., the speaker 207 of FIG. 2A).

In operation 1307, the electronic device may automatically perform a corresponding function based on the information of the classified external electronic device. According to an embodiment, the corresponding function may include a function of activating connectivity (e.g., connectivity through WiFi, Bluetooth, etc.) with the classified external electronic device and for transitioning the external electronic device to a controllable state. According to an embodiment, the electronic device may execute at least one pre-set different application based on the information of the classified external electronic device. For example, if the classified external electronic device is a TV, a remote control function may be activated to control the external electronic device.

According to various embodiments, the conventional complex process in which several steps are performed to control an intended external electronic device is excluded when establishing connectivity and performing an additional application. Instead, the aforementioned processes can be automatically performed with simply an operation of allowing the electronic device to be in contact with or approach the external electronic device.

According to various embodiments, an electronic device may include a display, a Printed Circuit Board (PCB) (e.g., the substrate 530 of FIG. 5A), a communication module comprising communication circuitry (e.g., the feeding portion or communication module 524 of FIG. 5A) disposed to the PCB, an Electro Magnetic Interference (EMI) detection module comprising EMI detecting circuitry (e.g., the EMI detection module 540 of FIG. 5A) disposed to the PCB, at least one antenna (e.g., the conductive segment or fourth lateral side 514 of FIG. 5A) electrically coupled in common to the communication module and the EMI detection module, and a processor. The processor may be configured to output an image using the display, control a communication configuration with an external electronic device using the communication module, detect an EMI signal using the antenna and the EMI detection module, and perform a designated operation based on at least the detected EMI signal.

According to various embodiments, the electronic device further includes a housing (e.g., the housing 210 of FIG. 2A). The housing may include a lateral member (e.g., the lateral member 216 of FIG. 2A). The lateral member may include a first lateral side (e.g., the first lateral side 2101 of FIG. 2A) having a first length, a second lateral side (e.g., the second lateral side 2102 of FIG. 2A) extending from the first lateral side in a vertical direction and having a second length, a third lateral side (e.g., the third lateral side 2103 of FIG. 2A) extending from the second lateral side to have the first length and to be in parallel with the first lateral side, and a fourth lateral side (e.g., the fourth lateral side 2104 of FIG. 2A) extending from the third lateral side to have the second length and to be in parallel with the second lateral side. The antenna may include a unit conductive segment (e.g., the conductive segment 514 of FIG. 5A) of the lateral member electrically separated by a pair of non-conductive segments (e.g., the non-conductive segments 5141 and 5142 of FIG. 5A) separated with a specific interval in the fourth lateral side.

According to various embodiments, the EMI detection module may be electrically coupled to the antenna via a second electrical path (e.g., the second electrical path 5401 of FIG. 5B) branched from a first electrical path (e.g., the first electrical path 5241 of FIG. 5B) which couples the antenna and the communication module.

According to various embodiments, a filtering member comprising a filter (e.g., the filtering member 560 of FIG. 5B) may be disposed on the second electrical path to filter the EMI signal among signals which are input via the first electrical path.

According to various embodiments, the filtering member may include at least one inductor having a value in a designated inductance range.

According to various embodiments, the inductance value may be substantially 100 nH.

According to various embodiments, at least one electric shock prevention circuit (e.g., the electric shock prevention circuit 570 of FIG. 5B) may be disposed in the first electrical path. The second electrical path may be branched between the antenna and the electric shock prevention circuit in the first electrical path.

According to various embodiments, at least one electric shock prevention circuit (e.g., the electric shock prevention circuit 571 of FIG. 5B) may be disposed between the filtering member and the EMI detection module in the second electrical path.

According to various embodiments, at least one electric shock prevention circuit (e.g., the electric shock prevention circuit 572 of FIG. 5C) and/or matching circuit (e.g., the matching circuit 5242 of FIG. 5C) disposed with a designated interval in a direction of the communication module from the antenna may be disposed in the first electrical path. The second electrical path may be branched between the electric shock prevention circuit and the matching circuit from the first electrical path.

According to various embodiments, a detection signal provided to the EMI detection module via the antenna may be detected in a frequency range less than or equal to 1 MHz.

According to various embodiments, the electronic device may further include at least two antennas, a switching member comprising a switch (e.g., the switching member 580 of FIG. 7) disposed between the antennas and the EMI detection module, and a sensor module comprising a sensor (e.g., the sensor module 590 of FIG. 7) operatively coupled with the processor and configured to detect status information of the electronic device. The processor may be configured to control an operation of the switching member based on the status information of the electronic device, provided via the sensor module, and to selectively couple the EMI detection module with any one of the antennas based on the operation of the switching member.

According to various embodiments, the sensor module may include a grip sensor module.

According to various embodiments, the housing (e.g., the housing 910 of FIGS. 9A and 9B) may include a conductive segment (e.g., the conductive segment 911 of FIGS. 9A and 9B) and a non-conductive segment (e.g., the non-conductive segment 912 of FIGS. 9A and 9B). The antenna (e.g., the conductive member 913 of FIGS. 9A and 9B) may include an antenna pattern of a Laser Direct Structuring (LDS) type, Thin Film Antenna type, Flexible Printed Circuit Board (FPCB) type, or Steel Use Stainless (SUS) type disposed to the non-conductive member in the space.

According to various embodiments, the antenna may include a transparent electrode pattern (e.g., the transparent pattern 1021 of FIG. 10) disposed to overlap with at least part of the display.

According to various embodiments, the antenna may include at least one coil member comprising a coil (e.g., the coil member 1100 of FIG. 11) disposed in the space of the electronic device.

According to various embodiments, the coil member may perform at least one of: Magnetic Secure Transmission (MST), wireless charging, and Near Field Communication (NFC) functions.

According to various embodiments, the electronic device may include a wearable electronic device (e.g., the wearable electronic device 1200 of FIG. 12A) configured to be worn on a wrist.

According to various embodiments, an electronic device may include a housing including a front plate, a rear plate spaced apart and facing a direction opposite the front plate, and a lateral member surrounding a space between the front plate and the rear plate, a display accommodated using at least part of the housing, a Printed Circuit Board (PCB), a communication module comprising communication circuitry disposed to the PCB, an Electro Magnetic Interference (EMI) detection module comprising EMI detecting circuitry disposed to the PCB, at least one first antenna electrically coupled with the communication module, at least one second antenna electrically coupled with the EMI detection module, and a processor. The processor may be configured to output an image using the display, control a communication configuration with an external electronic device using the communication module, detect an EMI signal using the second antenna and the EMI detection module, and perform a designated operation based on at least the detected EMI signal.

According to various embodiments, the housing may include a lateral member. The lateral member may include a first lateral side having a first length, a second lateral side extending from the first lateral side in a vertical direction and having a second length, a third lateral side extending from the second lateral side to have the first length and to be in parallel with the first lateral side, and a fourth lateral side extending from the third lateral side to have the second length and to be in parallel with the second lateral side. The second antenna may include a unit conductive segment electrically separated by a pair of non-conductive segments separated with a specific interval in at least one lateral side among the first lateral side, the second lateral side, the third lateral side, and the fourth lateral side.

Various example embodiments of the present disclosure have been disclosed and are merely examples presented for ease of understanding, and are not intended to limit the scope of the present disclosure. Therefore, in addition to the embodiments disclosed herein, various changes in forms and details made without departing from the technical concept of the present disclosure will be construed understood as being included in the scope of the present disclosure.

What is claimed is:

1. An electronic device comprising:
   a display;
   a Printed Circuit Board (PCB);
   a communication module comprising communication circuitry;
   an Electro Magnetic Interference (EMI) detection module comprising EMI detecting circuitry disposed on the PCB, and configured to detect an EMI signal generated from an external device;
   at least one antenna electrically coupled to the communication module and the EMI detection module; and
   a processor,
   wherein the processor is configured to:
      output an image using the display;
      control a communication configuration of the electronic device with an external electronic device using the communication module;
      detect the EMI signal generated from the external device using the at least one antenna and the EMI detection module;
      identify the external device based on the detected EMI signal and
      perform a designated operation based on at least the identification,
   wherein the EMI detection module is electrically coupled to the at least one antenna via a second electrical path branched from a first electrical path, the first electrical path coupling the at least one antenna and the communication module,
   wherein a filtering member comprising a filter is disposed in the second electrical path and is configured to filter the EMI signal from among signals which are input via the first electrical path.

2. The electronic device of claim 1, further comprising a housing,
   wherein the housing comprises a lateral member,
   wherein the lateral member comprises a first lateral side having a first length, a second lateral side extending from the first lateral side in a vertical direction and having a second length, a third lateral side extending from the second lateral side to have the first length and to be in parallel with the first lateral side, and a fourth lateral side extending from the third lateral side to have the second length and to be in parallel with the second lateral side, and
   wherein the at least one antenna comprises a unit conductive segment electrically separated by a pair of non-conductive segments separated with a specific interval in the fourth lateral side.

3. The electronic device of claim 1, wherein the filtering member includes at least one inductor having a value in a designated inductance range.

4. The electronic device of claim 3, wherein the inductance value is substantially 100 nH.

5. The electronic device of claim 1,
   wherein at least one electric shock prevention circuit is disposed in the first electrical path, and
   wherein the second electrical path is branched between the at least one antenna and the electric shock prevention circuit in the first electrical path.

6. The electronic device of claim 5, wherein at least one electric shock prevention circuit is disposed between the filtering member and the EMI detection module in the second electrical path.

7. The electronic device of claim 1,
   wherein at least one electric shock prevention circuit and/or matching circuit disposed with a designated interval in a direction of the communication module from the at least one antenna is disposed in the first electrical path, and wherein the second electrical path is branched between the electric shock prevention circuit and the matching circuit in the first electrical path.

8. The electronic device of claim 1, wherein a detection signal provided to the EMI detection module via the at least one antenna is detected in a frequency range of less than or equal to 1 MHz.

9. The electronic device of claim 1, further comprising:
at least two antennas; a switching member comprising a switch disposed between the antennas and the EMI detection module; and a sensor module comprising at least one sensor operatively coupled with the processor and configured to detect status information of the electronic device,
wherein the processor is configured to control an operation of the switching member based on the status information of the electronic device provided via the sensor module, and to selectively couple the EMI module with any one of the antennas based on the operation of the switching member.

10. The electronic device of claim 9, wherein the sensor module includes a grip sensor module.

11. The electronic device of claim 1, further comprising a housing,
wherein the housing includes a conductive segment and a non-conductive segment, and
wherein the antenna comprises an antenna pattern of a Laser Direct Structuring (LDS) type, Thin Film Antenna type, Flexible Printed Circuit Board (FPCB) type, or Steel Use Stainless (SUS) type.

12. The electronic device of claim 1, wherein the at least one antenna comprises a transparent electrode pattern disposed to overlap with at least part of the display.

13. The electronic device of claim 1, wherein the at least one antenna comprises at least one coil member comprising a coil disposed in the electronic device.

14. The electronic device of claim 13, wherein the coil member performs at least one of: Magnetic Secure Transmission (MST), wireless charging, or Near Field Communication (NFC) functions.

15. The electronic device of claim 1, wherein the electronic device comprises a wearable electronic device configured to be worn on a wrist.

16. A portable electronic device comprising:
a housing comprising a front plate, a rear plate spaced apart and facing a direction opposite the front plate, and a lateral member surrounding a space between the front plate and the rear plate;
a display accommodated in at least part of the housing;
a Printed Circuit Board (PCB);
a communication module comprising communication circuitry;
an Electro Magnetic Interference (EMI) detection module comprising EMI detecting circuitry disposed on the PCB, and configured to detect an EMI signal generated from an external device;
at least one first antenna electrically coupled with the communication module;
at least one second antenna electrically coupled with the EMI detection module; and
a processor, wherein the processor is configured to:
output an image using the display;
control a communication configuration of the portable electronic device with an external electronic device using the communication module;
detect the EMI signal generated from the external electronic device using the at least one second antenna and the EMI detection module;
identify the external electronic device based on the detected EMI signal, and
perform a designated operation based on at least the identification,
wherein the EMI detection module is electrically coupled to the at least one second antenna via a second electrical path branched from a first electrical path, the first electrical path coupling the at least one first antenna and the communication module,
wherein a filtering member comprising a filter is disposed in the second electrical path and is configured to filter the EMI signal from among signals which are input via the first electrical path.

17. The electronic device of claim 16,
wherein the housing comprises a lateral member,
wherein the lateral member comprises a first lateral side having a first length, a second lateral side extending from the first lateral side in a vertical direction and having a second length, a third lateral side extending from the second lateral side to have the first length and to be in parallel with the first lateral side, and a fourth lateral side extending from the third lateral side to have the second length and to be in parallel with the second lateral side, and
wherein the second antenna comprises a unit conductive segment electrically separated by a pair of non-conductive segments separated with a specific interval in at least one lateral side among the first lateral side, the second lateral side, the third lateral side, and the fourth lateral side.

18. The electronic device of claim 16,
wherein the housing includes a conductive segment and a non-conductive segment, and
wherein the antenna comprises an antenna pattern of a Laser Direct Structuring (LDS) type, Thin Film Antenna type, Flexible Printed Circuit Board (FPCB) type, or Steel Use Stainless (SUS) type.

* * * * *